US010879751B2

(12) United States Patent
Takahashi

(10) Patent No.: US 10,879,751 B2
(45) Date of Patent: Dec. 29, 2020

(54) ROTATING ELECTRIC MACHINE

(71) Applicant: DENSO CORPORATION, Kariya (JP)

(72) Inventor: Tomoya Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 247 days.

(21) Appl. No.: 16/173,281

(22) Filed: Oct. 29, 2018

(65) Prior Publication Data

US 2019/0140499 A1 May 9, 2019

(30) Foreign Application Priority Data

Nov. 7, 2017 (JP) .................. 2017-214448

(51) Int. Cl.
| | |
|---|---|
| *H02K 1/26* | (2006.01) |
| *H02K 1/28* | (2006.01) |
| *H02P 21/00* | (2016.01) |
| *H03K 7/08* | (2006.01) |
| *H02K 1/16* | (2006.01) |
| *H02K 21/16* | (2006.01) |
| *H02P 6/18* | (2016.01) |
| *H02P 29/50* | (2016.01) |
| *H02P 27/08* | (2006.01) |
| *H02K 1/27* | (2006.01) |

(52) U.S. Cl.
CPC .............. *H02K 1/26* (2013.01); *H02K 1/16* (2013.01); *H02K 1/276* (2013.01); *H02K 1/28* (2013.01); *H02K 21/16* (2013.01); *H02P 6/183* (2013.01); *H02P 21/50* (2016.02); *H02P 27/08* (2013.01); *H02P 29/50* (2016.02); *H03K 7/08* (2013.01)

(58) Field of Classification Search
CPC .......... H02P 6/183; H02P 29/50; H02P 27/08; H02K 1/276
USPC ............................... 318/400.24, 400.01, 700
See application file for complete search history.

(56) References Cited

U.S. PATENT DOCUMENTS 6,388,416 B1 * 5/2002 Nakatani ................. H02P 6/085
318/700

FOREIGN PATENT DOCUMENTS

| JP | 3687603 B2 | 8/2005 |
|---|---|---|
| JP | 2018-186591 A | 11/2018 |

* cited by examiner

*Primary Examiner* — David Luo
(74) *Attorney, Agent, or Firm* — Oliff PLC

(57) ABSTRACT

A rotating electric machine has a drive control part and a motor having a stator and a rotor. The drive control part has an external disturbance voltage instruction generation part, a switching signal generation part, first and second drive circuits, a current acquisition part detecting an external disturbance current flowing in three phase winding in each of a first coil and a second coil of the stator, and a phase angle estimation part detecting a phase angle of the rotor of the motor based on the detected external disturbance current. The drive control part adjusts turn-on/turn-off timings of switching signals so as to reduce a timing difference between corresponding line external disturbance voltages in the three phase windings more than the time difference without performing the timing adjustment while maintaining a duty ratio of these line external disturbance voltages to that when the timing adjustment is not performed.

16 Claims, 31 Drawing Sheets

<COMPARATIVE EXAMPLE>

<COMPARATIVE EXAMPLE>

<COMPARATIVE EXAMPLE>

<FIRST EXEMPLARY EMBODIMENT>

<FIRST EXEMPLARY EMBODIMENT>

<THIRD EXEMPLARY EMBODIMENT>

FIG.14
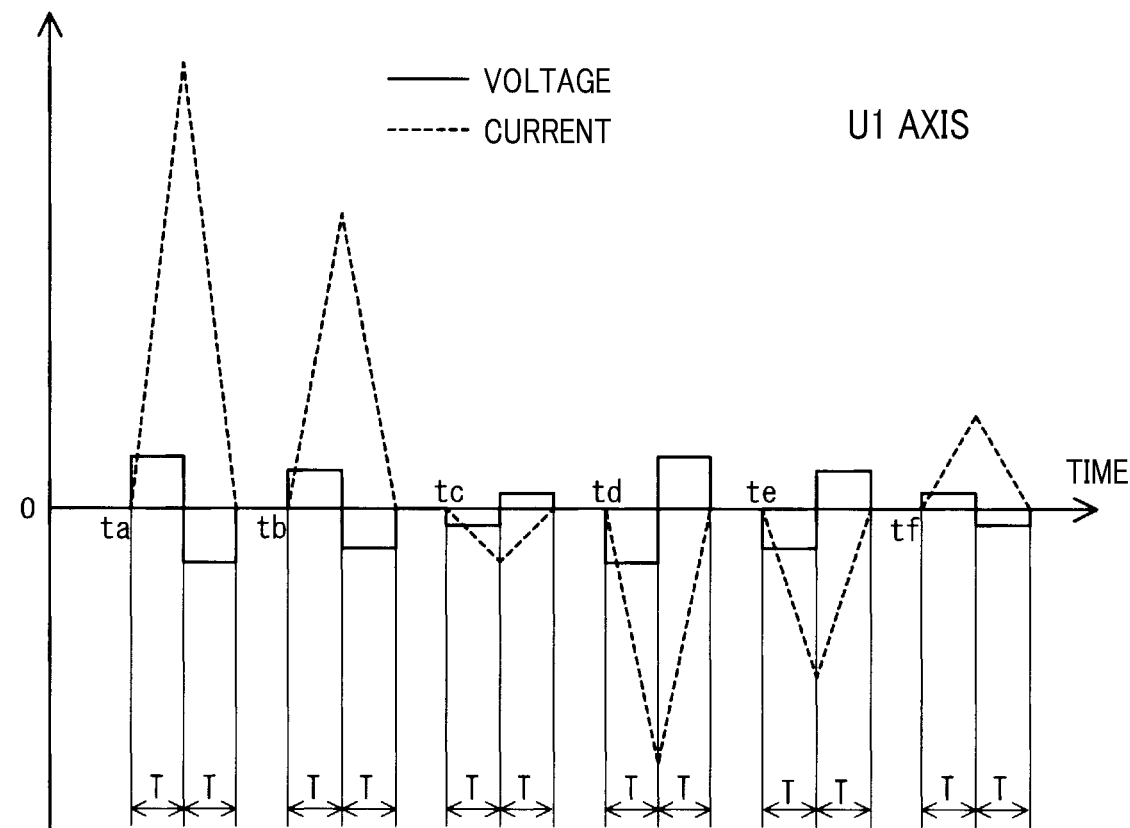
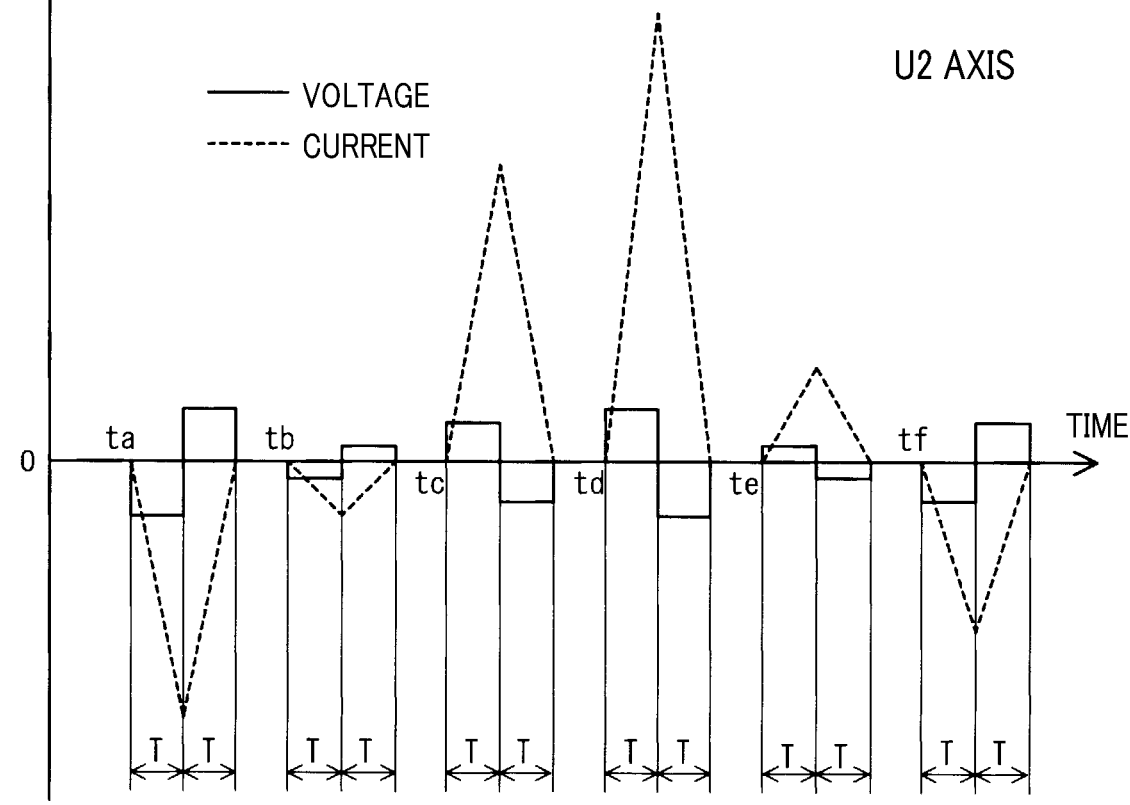

FIG.15
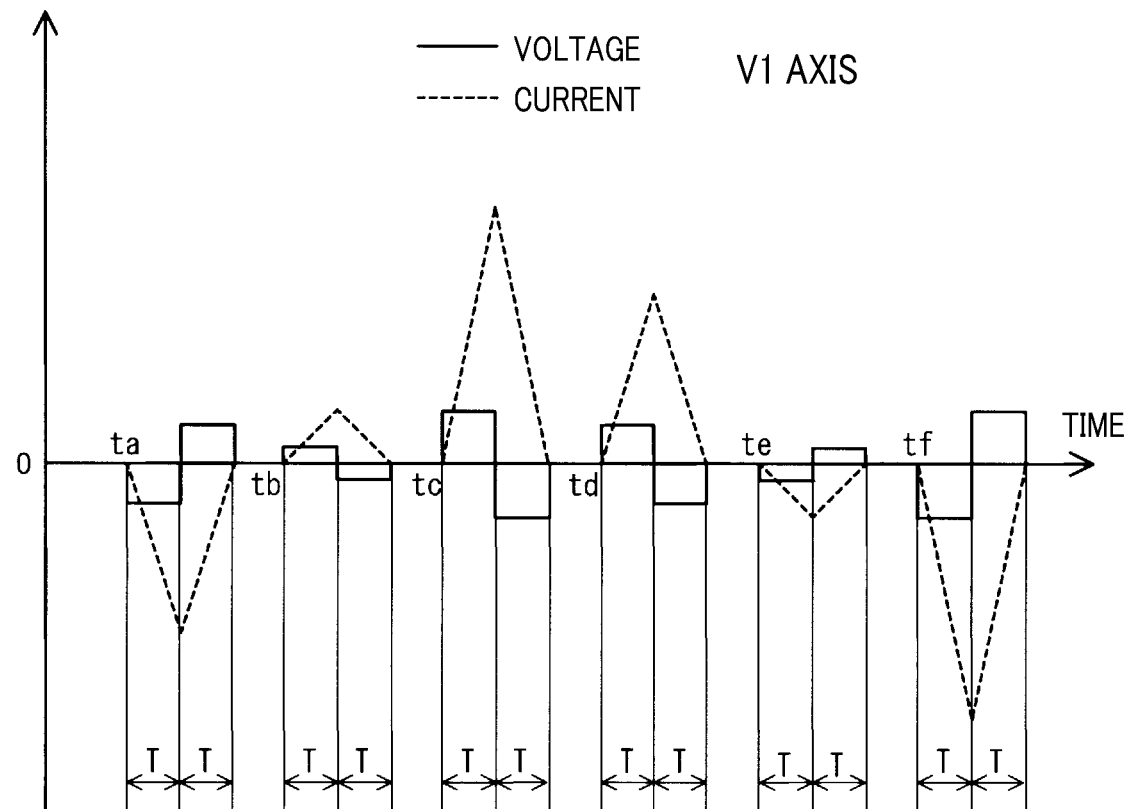
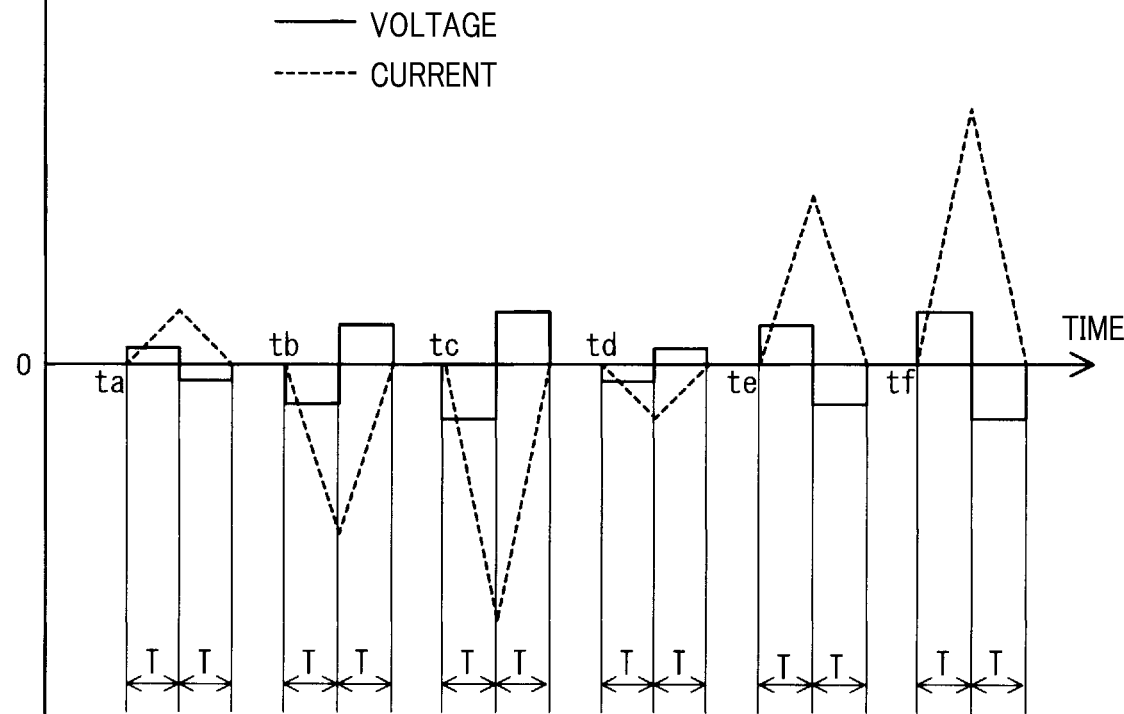

FIG.16
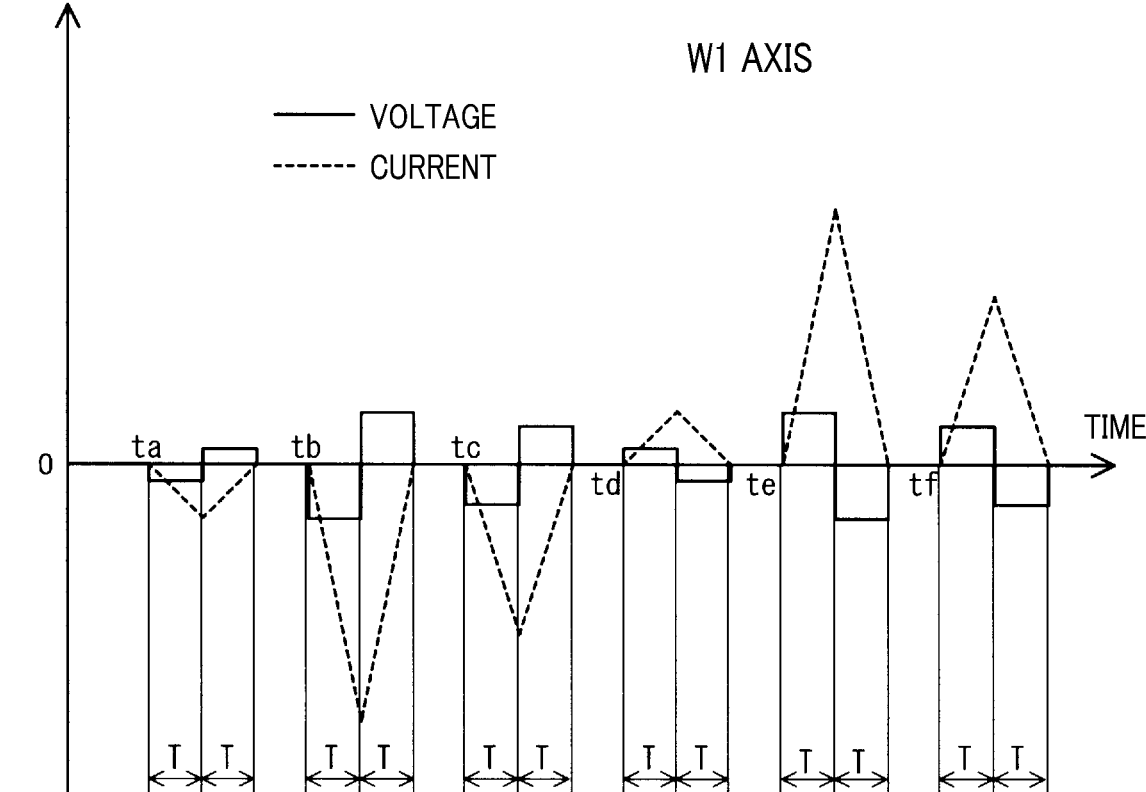
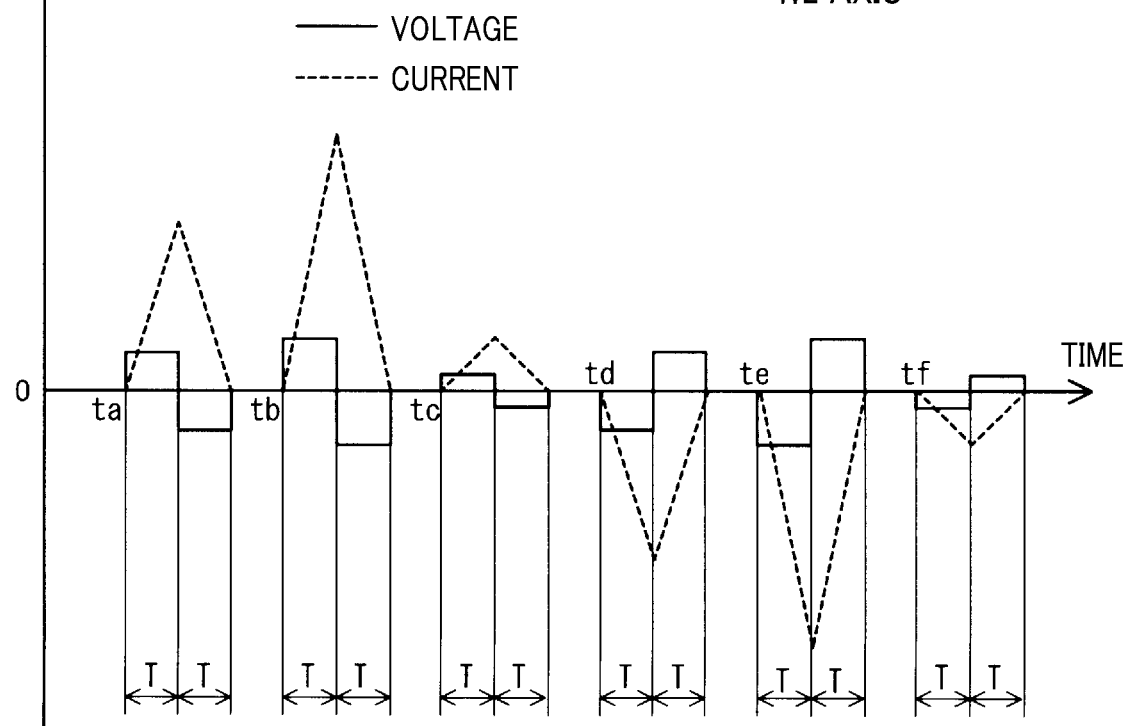

FIG.17
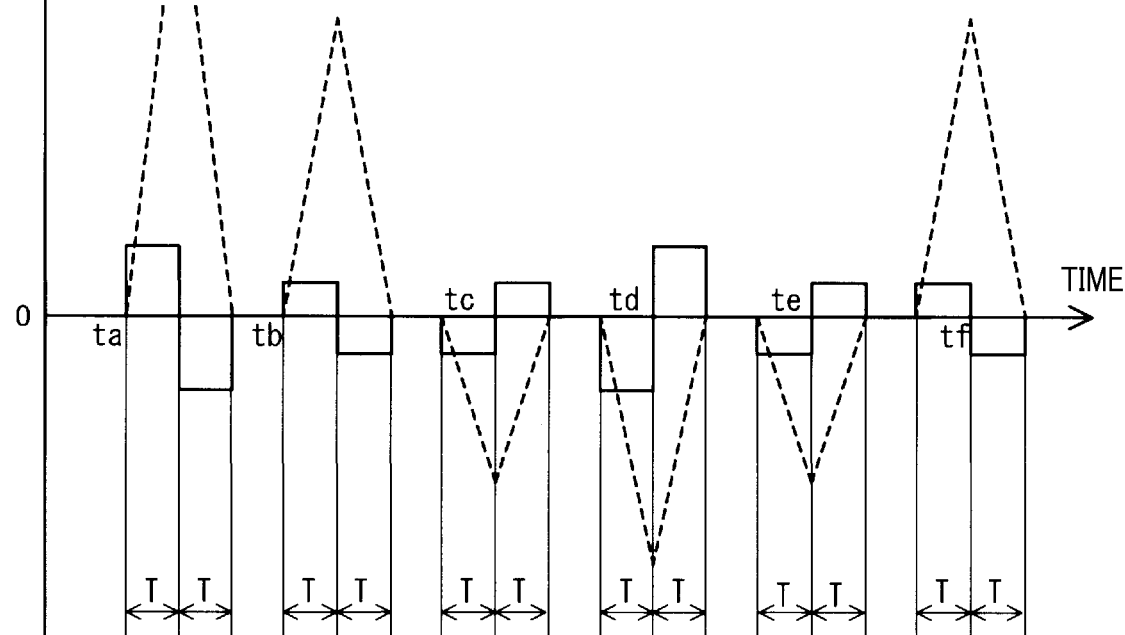
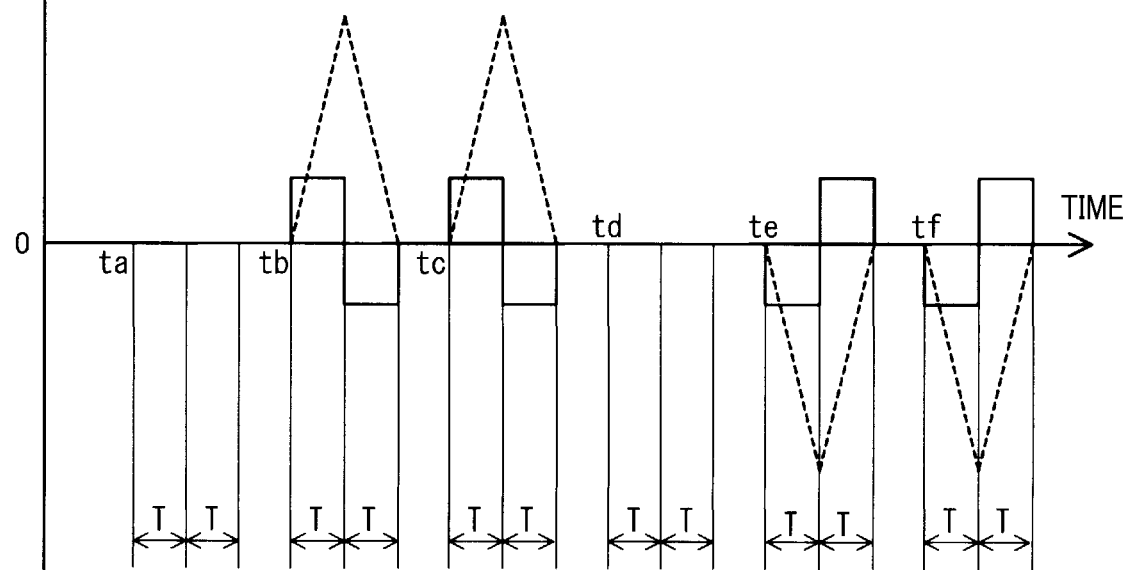

ROTATING ELECTRIC MACHINE

CROSS-REFERENCE TO RELATED APPLICATION

This application is related to and claims priority from Japanese Patent Application No. 2017-214448 filed on Nov. 7, 2017, the contents of which are hereby incorporated by reference.

BACKGROUND OF THE INVENTION

1. Field of the Invention

The present invention relates to rotating electric machines capable of estimating a phase angle of a rotor thereof.

2. Description of the Related Art

In Patent document 1, as a related art, Japanese patent No. 3687603 discloses a technique regarding a rotating electric machine capable of detecting a current variation of a current caused in a synchronous motor when receiving a drive voltage in which a pulse voltage has been superimposed on the drive voltage, and of estimating a phase angle of a rotor. The phase angle indicates a current position of a magnetic pole on the basis of a magnitude of the detected current variation.

However, when such a pulse voltage is superimposed on a drive voltage to be supplied to the synchronous motor, this pulse voltage becomes an external disturbance, and noise is generated due to the external disturbance. Accordingly, in order to correctly estimate a phase angle of the rotor in the synchronous motor, it is necessary to suppress noise from being generated in the synchronous motor even if such a pulse voltage is interposed on the drive voltage.

SUMMARY

It is therefore desired to provide a rotating electric machine capable of estimating a phase angle of a rotor therein with high accuracy while suppressing generation of noise.

In accordance with an aspect of the present invention, there is provided a rotating electric machine which has a motor and a drive control part. The motor has a stator and a rotor. The stator has windings three phase windings in a first coil and a second coil. The rotor has magnetic poles. The drive control part supplies drive voltages (or phase voltages) to the three phase windings. The drive control part has an external disturbance voltage instruction generation part, a switching signal generation part, a drive circuit and a current acquisition part, a phase angle estimation part and an adjustment part. The external disturbance voltage instruction generation part generates external disturbance voltage instruction signals to be used for superimposing external disturbance pulse voltages onto the three phase windings in the first coil and the second coil. The switching signal generation part generates switching signals on the basis of the external disturbance voltage instruction signals. The switching signals are used for superimposing the external disturbance pulse voltages on the drive voltage to be supplied to the three phase windings in the first coil and the second coil. The drive circuit supplies the drive voltages on which the external disturbance pulse voltages have been superimposed to the three phase windings in the first coil and the second coil on the basis of the switching signals. The current acquisition part acquires an external disturbance current generated in the three phase windings in the first coil and the second coil by superimposing the external disturbance pulse voltages on the drive voltage to be supplied to the three phase windings in the first coil and the second coil. The phase angle estimation part estimates a phase angle of the rotor in the motor on the basis of the acquired external disturbance current. The adjustment part adjusts a turn-on timing (or a rise timing) and a turn-off timing (or a fall timing) of the switching signals so as to reduce a timing difference between corresponding line external disturbance voltages superimposed on the drive voltages (or phase voltages) to be supplied to the three phase windings in the first coil and the second coil of the stator more than a timing difference between the corresponding line external disturbance voltages when the adjustment of the turn-on timing and the turn-off timing of the switching signals is not performed while maintaining a duty ratio of line external disturbance voltages between the three phase windings in the first coil and the second coil to a duty ratio of the line external disturbance voltages when the adjustment of the turn-on timing and the turn-off timing of the switching signals is not performed.

According to the present invention previously described, because the improved structure of the rotating electric machine having the three phase windings of not less than two systems such as the first coil and the second coil reduces a timing difference between the line external disturbance voltages of the three phase windings is reduced while maintaining the duty ratio of the line external disturbance voltages, it is possible to improve a force balance generated in the motor even if the external disturbance pulse voltages generated by the external disturbance voltage instruction signals are superimposed on the drive voltages (or the phase voltages) to be supplied to the three phase windings in the first coil and the second coil of the stator of the motor, and thereby possible to reduce noise of the motor in the rotating electric machine.

BRIEF DESCRIPTION OF THE DRAWINGS

A preferred, non-limiting embodiment of the present invention will be described by way of example with reference to the accompanying drawings, in which:

FIG. 14 is a graph showing a time change of a modulation rate of the external disturbance voltage and a time change of an external disturbance current in a U phase of windings in the stator of the motor in the rotating electric machine according to the present invention;

FIG. 15 is a graph showing a time change of a modulation rate of the external disturbance voltage and a time change of an external disturbance current in a V phase of the windings in the stator of the motor in the rotating electric machine according to the present invention;

FIG. 16 is a graph showing a time change of a modulation rate of the external disturbance voltage and a time change of an external disturbance current in a W phase of the windings in the stator of the motor in the rotating electric machine according to the present invention;

FIG. 17 is a graph showing a time change of a modulation ratio in the d axis and the q axis of the external disturbance pulse voltages, which correspond to the external disturbance pulse voltages shown in FIG. 14 to FIG. 16, and a time change of the external disturbance currents in the first coil of the stator;

DETAILED DESCRIPTION OF THE PREFERRED EMBODIMENTS

Figure 1:
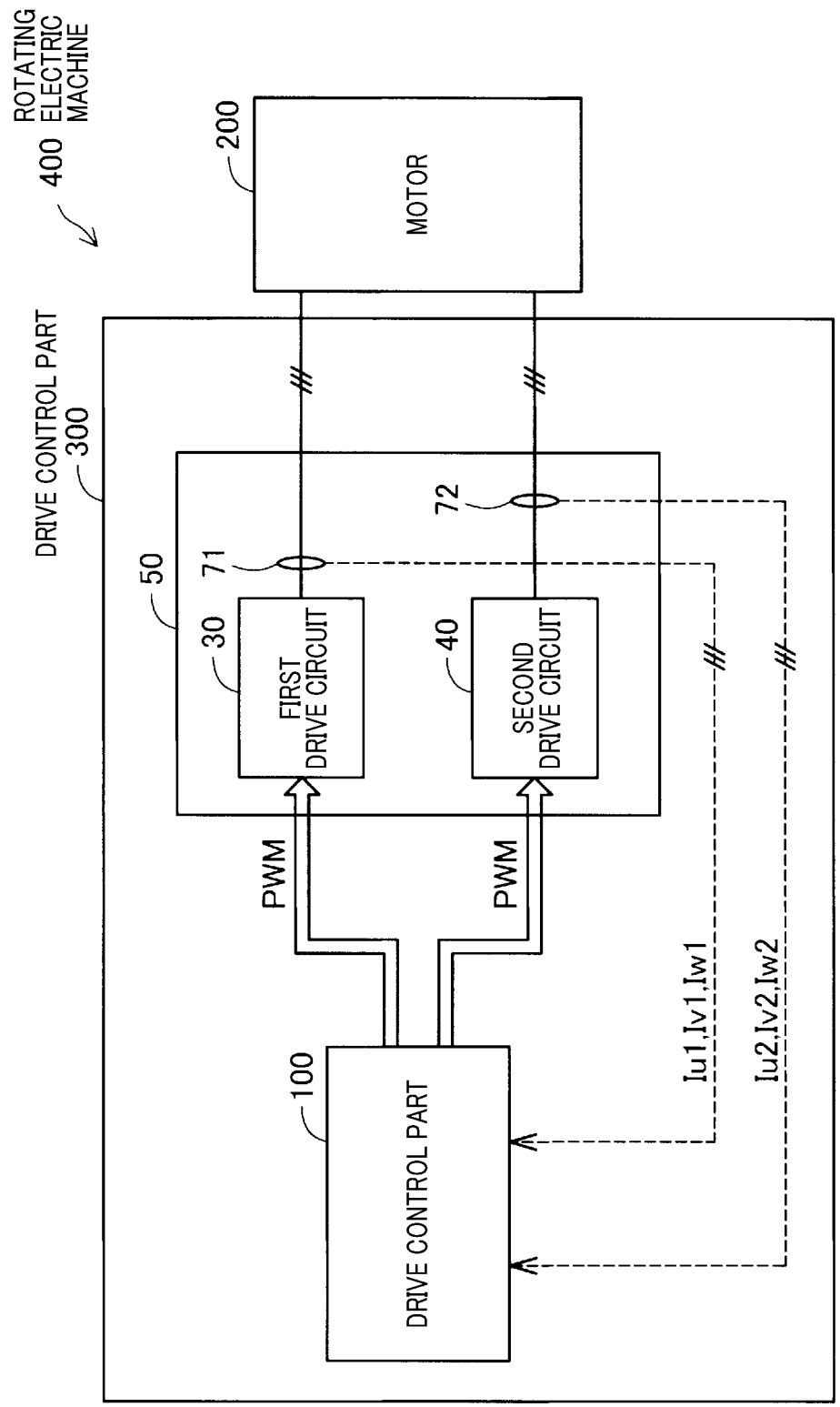
FIG. 1 is a view showing a structure of a rotating electric machine according to the present invention.

Hereinafter, various embodiments of the present invention will be described with reference to the accompanying drawings. In the following description of the various embodiments, like reference characters or numerals designate like or equivalent component parts throughout the several diagrams.

First Exemplary Embodiment

A description will be given of the rotating electric machine 400 according to a first exemplary embodiment of the present invention with reference to FIG. 1 to FIG. 10A, FIG. 10B and FIG. 10C.

FIG. 1 is a view showing a structure of the rotating electric machine 400 according to the first exemplary embodiment of the present invention. As shown in FIG. 1, the rotating electric machine 400 according to the first exemplary embodiment has a motor 200 and a drive control part 300.

The drive control part 300 has a motor drive unit 50 and a control part 100. The motor 200 in the first exemplary embodiment is a synchronous motor with a permanent magnet type or a permanent magnet synchronous motor.

The motor drive unit 50 has a first drive circuit 30 and a second drive circuit 40. The first drive circuit 30 and the second drive circuit 40 drive dual three phase windings of a stator 220 in the motor 200.

The control part 200 generates pulse width modulation (PWM) signals (as switching signals) and transmits the PWM signals to the first drive circuit 30 and the second drive circuit 40 so as to adjust the drive voltages (or phase voltages) supplied to the dual three phase windings of the stator 220. A first current sensor 71 and a second current sensor 72 are arranged at the three phase windings through which the motor 200 is connected to the first drive circuit 30 and the second drive circuit 40.

The first current sensor 71 detects three phase current values Iu1, Iv1 and Iw1 and transmits the three phase current values Iu1, Iv1 and Iw1 to the control part 100. The second current sensor 72 detects and transmits three phase current values Iu2, Iv2 and Iw2 to the control part 100.

Figure 2:
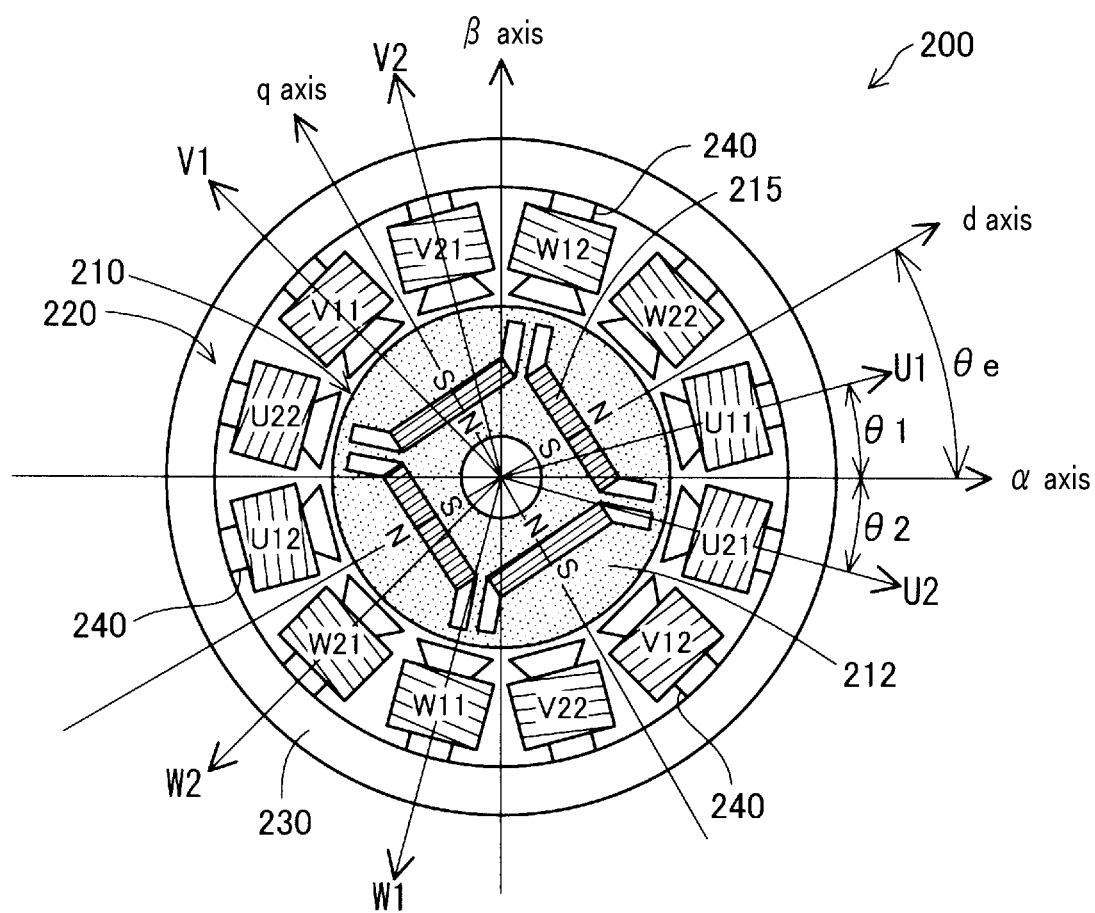
FIG. 2 is a view showing a structure of a stator and a rotor forming a motor in the rotating electric machine according to the present invention shown in FIG. 1.

FIG. 2 is a view showing a structure of a stator and a rotor forming a motor (M) 200 in the rotating electric machine 400 according to the present invention shown in FIG. 1.

As shown in FIG. 2, the motor 200 has a rotor 210 and the stator 220. The rotor 210 is composed of a field winding. The rotor 210 is an interior permanent magnet (IPM) type composed of a rotor core 212 and permanent magnets embedded in the inside of the rotor core 212.

The stator 220 has a stator core 230, teeth 240 formed in the stator core 230 and windings. The windings are composed of a first three phase winding in a first system and a second three phase winding in a second system. The first three phase windings is composed of a first U phase coil U1, a first V phase coil V1 and a first W phase coil W1. The second three phase windings is composed of a second U phase coil U2, a second V phase coil V2 and a second W phase coil W2.

The first three phase winding and the second three phase winding are wound around the teeth 240 of the stator core 230. The first drive circuit 30 drives the first three phase winding in the first system. The second drive circuit 40 drives the second three phase winding in the second system.

Hereinafter, the first three phase winding in the first system will be referred to a first coil 221 (see FIG. 4). Similarly, the second three phase winding in the second system will be referred to a second coil 222 (see FIG. 4).

As shown in FIG. 2, the first U phase coil U1 is composed of a U phase coil U11 and a U phase coil U12 connected in series. As shown in FIG. 2, the U phase coil U11 and the U phase coil U12 in the first U phase coil U1 face from each other through the rotor 210.

The first V phase coil V1 is arranged at a location which is shifted from the first U phase coil U1 around the circumferential direction of the stator 220 by 120 degrees. The first V phase coil V1 is composed of a V phase coil V11 and a V phase coil V12 connected in series. The V phase coil V11 and the V phase coil V12 in the first V phase coil V1 face from each other through the rotor 210.

Similarly, the first W phase coil W1 is arranged at a location which is shifted from the first V phase coil V1 around the circumferential direction of the stator 220 by 120 degrees. The first W phase coil W1 is composed of a W phase coil W11 and a W phase coil W12 connected in series. The W phase coil W11 and the W phase coil V12 in the first W phase coil W1 face from each other through the rotor 210.

The first U phase coil U1, the first V phase coil V1 and the first W phase coil W1 in the first system, i.e. in the first coil 212 are electrically connected at a neutral point M1 to form a Y connection. The neutral point M1 will be explained later.

The second U phase coil is arranged at a location which is shifted from the first U phase coil U1 around the circumferential direction of the stator 220 by 30 degrees.

The second U phase coil U2 is composed of a U phase coil U21 and a U phase coil U22 connected in series. As shown in FIG. 2, the U phase coil U21 and the U phase coil U22 in the second U phase coil U2 face from each other through the rotor 210.

The second V phase coil V2 is arranged at a location which is shifted from the first V phase coil V1 around the circumferential direction of the stator 220 by 30 degrees. The second V phase coil V2 is composed of a V phase coil V21 and a V phase coil V22 connected in series. The V phase coil V21 and the V phase coil V22 in the second V phase coil V2 face from each other through the rotor 210.

Similarly, the second W phase coil W2 is arranged at a location which is shifted from the first W phase coil W1 around the circumferential direction of the stator 220 by 30 degrees. The second W phase coil W2 is composed of a W phase coil W21 and a W phase coil W22 connected in series. The W phase coil W21 and the W phase coil V22 in the second W phase coil W2 face from each other through the rotor 210.

The second U phase coil U2, the second V phase coil V2 and the second W phase coil W2 in the second system, i.e. in the second coil 222 are electrically connected at a neutral point to form a Y connection. The neutral point M2 will be explained later.

In the structure of the rotating electric machine 400 according to the first exemplary embodiment, the first U phase coil U1, the first V phase coil V1, the first W phase coil W1 and the second U phase coil U2, the second V phase coil V2 and the second W phase coil W2 are located by 30 degrees (=θ1+θ2) from each other around the rotating direction of the rotor 210.

In the first exemplary embodiment, the α axis passes through an intermediate point between the U phase coil U11 of the first U phase coil U1 and the U phase coil U21 of the second U phase coil U2. The α axis is used as a reference position of a phase angle θe of the rotor 210. The phase angle θe of the rotor 210 is determined by using the rotation position in the N pole of a permanent magnet 215 of the rotor 210 on the basis of an angle measured counterclockwise from the α axis of the stator 220. That is, the first U phase coil U1 is arranged at an offset position by θ1 measured from the α axis. The second U phase coil U2 is arranged at an offset position by −θ2 measured from the α axis. In the first exemplary embodiment, the angle θ1 is equal to the angle −θ2, i.e. 15 degrees. It is also acceptable to arrange each of the first U phase coil U1, the first V phase coil V, the first W phase coil W1, the second U phase coil U2, the second V phase coil V2 and the second W phase coil W2 without any offset.

The control part 100 shown in FIG. 1 performs a current vector control using a d-q coordinate system so as to control the rotation operation of the motor 200. The d axis indicates the direction to which the magnetic field of the permanent magnets 215 mounted in the rotor 210 penetrates. The direction of the N pole indicates the positive direction of the d axis. The q axis progresses in electrical angle from the d axis by 90 degrees. In the d-q coordinate system, a d axis component of the current vector is a d axis current, and a q axis component of the current vector is a q axis current. The magnetic field is generated by the q axis current. Accordingly, the q axis current generates a torque of the motor 200, i.e. generates a motor torque.

On the other hand, because the d axis current generates a magnetic flux in the d axis direction, no motor torque is generated by the d axis current. That is, the d axis current prevents the magnetic field from being reduced.

The control part 100 performs the current phase control so as for the motor 200 to generate a maximum motor torque. In order to perform the current phase control, the control part 100 estimates a phase angle θe of the rotor 210 in the motor 200.

It is possible for the control part 100 to perform a sensor-less drive control so as to estimate the phase angle θe of the rotor 210 on the basis of voltage information and current information obtained by the first drive circuit 30 and the second drive circuit 40.

However, it is necessary for a usual sensor-less drive control to use the voltage information regarding a counter electro-motive force corresponding to the rotation angle of the permanent magnets 215 when the usual sensor-less drive control performs the estimation method of estimating the phase angle θe of the rotor 210. Accordingly, it is difficult for the usual sensor-less drive control to correctly estimate the phase angle θe of the rotor 210 when the rotor 210 stops or rotates at a low rotation speed.

In order to solve such drawback, in the rotating electric machine according to the first exemplary embodiment, the control part 100 adds an external disturbance voltage to the three phase windings so as to correctly estimate the phase angle θe of the rotor 210 with high accuracy even if the rotor 210 stops or rotates at a low rotation speed.

Figure 3:
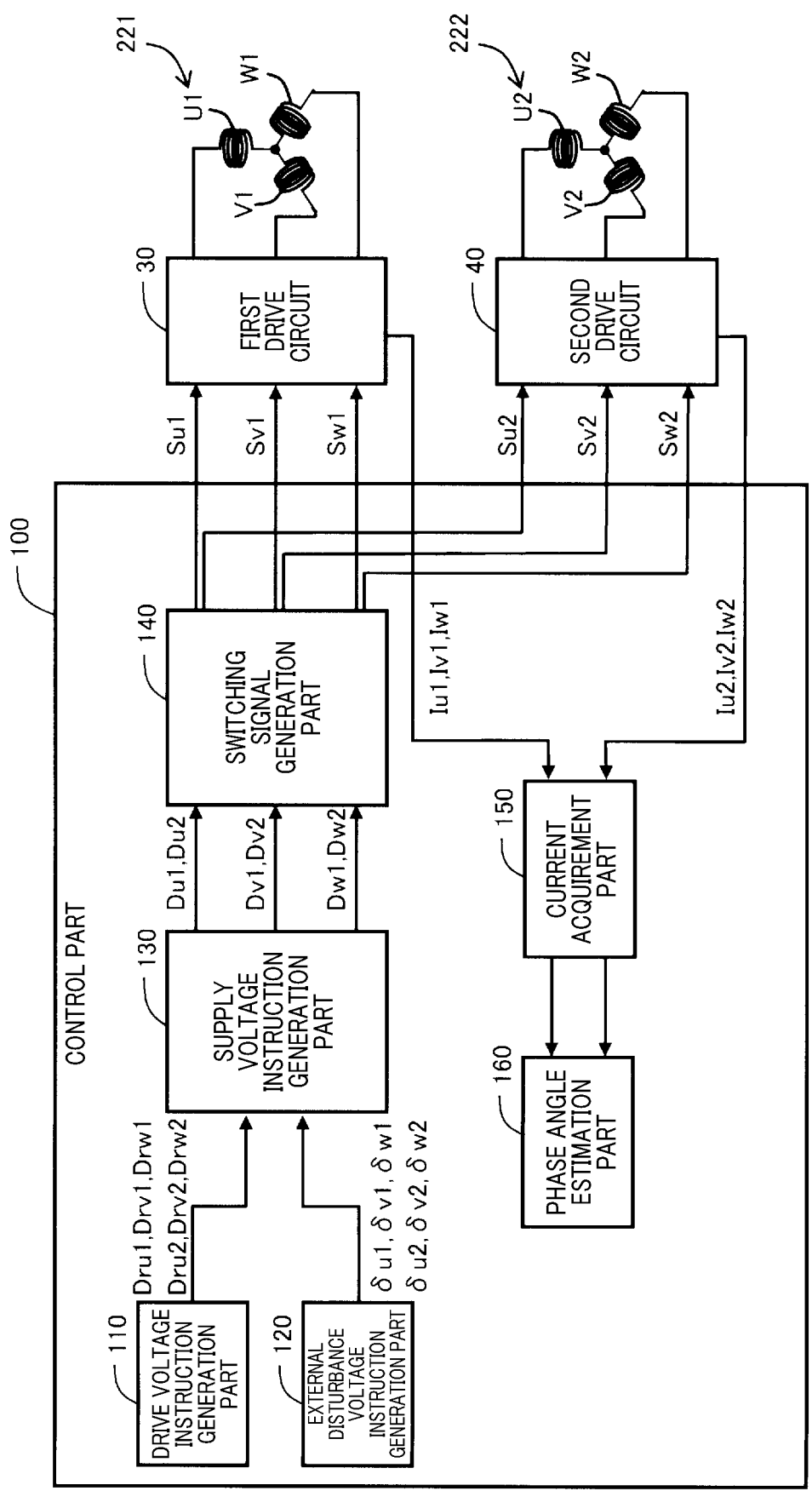
FIG. 3 is a view showing a functional structure of a control part in a drive control part of the rotating electric machine according to the present invention shown in FIG. 1.

FIG. 3 is a view showing a functional structure of the control part 100 in the drive control part 300 of the rotating electric machine 400 according to the present invention shown in FIG. 1.

As shown in FIG. 3, the control part 100 has a drive voltage instruction generation part 110, an external disturbance voltage instruction generation part 120, a supply voltage instruction generation part 130, a switching signal generation part 140, a current acquisition part 150, and a phase angle estimation part 160.

For example, the control part 100 is composed of a computer system having a processor and a memory part. The processor in the control part 100 executes various control programs stored in the memory part such as a non-volatile memory so as to realize the functional blocks shown in FIG. 3. It is acceptable to use hardware circuits to realize these functional blocks.

As shown in FIG. 3, the drive voltage instruction generation part 110 generates drive voltage instruction signals Dru1, Drv1 and Drw1 to be used for the first U phase coil U1, the first V phase coil V1 and the first W phase coil W1 in the first coil 221. The drive voltage instruction generation part 110 further generates drive voltage instruction signals Dru2, Drv2 and Drw2 to be used for the second U phase coil U2, the second V phase coil V2 and the second W phase coil W2 in the second coil 222.

As shown in FIG. 3, the external disturbance voltage instruction generation part 120 generates external disturbance voltage instruction signals δu1, δv1 and δw1 to be used for the first U phase coil U1, the first V phase coil V1 and the first W phase coil W1 in the first coil 221.

Further, the external disturbance voltage instruction generation part 120 generates external disturbance voltage instruction signals δu2, δv2 and δw2 to be used for the second U phase coil U2, the second V phase coil V2 and the second W phase coil W2 in the second coil 222.

As shown in FIG. 3, the supply voltage instruction generation part 130 generates supply voltage instruction signals Du1, Dv1 and Dw1 of the three phase windings U1, V1 and W1 to be used for the first U phase coil U1, the first V phase coil V1 and the first W phase coil W1 in the first coil 221 on the basis of the drive voltage instruction signals Dru1, Drv1 and Drw1 and the external disturbance voltage instruction signals δu1, δv1 and δw1.

Further, the supply voltage instruction generation part 130 generates supply voltage instruction signals Du2, Dv2 and Dw2 to be used for the second U phase coil U2, the second V phase coil V2 and the second W phase coil W2 in the second coil 222 on the basis of the drive voltage instruction signals Dru2, Drv2 and Drw2 and the external disturbance voltage instruction signals δu2, δv2 and δw2.

In more detail, the supply voltage instruction generation part 130 adds the drive voltage instruction signals Dru1, Drv1 and Drw1 and the external disturbance voltage instruction signals δu1, δv1 and δw1, respectively so as to generate the supply voltage instruction signals Du1, Dv1 and Dw1 to be used for the first U phase coil U1, the first V phase coil V1 and the first W phase coil W1 in the first coil 221.

Further, the supply voltage instruction generation part 130 adds the drive voltage instruction signals Dru2, Drv2 and Drw2 and the external disturbance voltage instruction signals δu2, δv2 and δw2, respectively to be used for the second U phase coil U2, the second V phase coil V2 and the second W phase coil W2 in the second coil 222.

The switching signal generation part 140 generates switching signals Su1, Sv1 and Sw1 to be transmitted to the first U phase coil U1, the first V phase coil V1 and the first W phase coil W1 in the first coil 221, respectively.

Further, the switching signal generation part 140 generates switching signals Su1, Sv2 and Sw2 to be transmitted to the second U phase coil U2, the second V phase coil V2 and the second W phase coil W2 in the second coil 222 on the basis of the supply voltage instruction signals Du1, Dv1 and Dw1 and the supply voltage instruction signals Du2, Dv2 and Dw2.

In the structure of the rotating electric machine 400 according to the first exemplary embodiment, the switching signal generation part 140 compares the supply voltage instruction signals with PWM comparison waves so as to generate these switching signals.

The current acquisition part 150 receives the three phase current values Iu1, Iv1 and Iw1 transmitted from the first drive circuit 30 and the three phase current values Iu2, Iv2 and Iw2 transmitted from the second drive circuit 40. That is, as shown in FIG. 1, the first current sensor 71 has detected the three phase current values Iu1, Iv1 and Iw1, and the second current sensor 72 has detected the three phase current values Iu2, Iv2 and Iw2.

Each of the three phase current values Iu1, Iv1 and Iw1 and the three phase current values Iu2, Iv2 and Iw2 has contained the corresponding external disturbance current which corresponds to an external disturbance pulse voltage supplied into each coil on the basis of the external disturbance voltage instruction signal.

The phase angle estimation part 160 estimates the phase angle θe of the rotor 210 on the basis of the external disturbance current value contained in the three phase current values Iu1, Iv1 and Iw1 and the three phase current values Iu2, Iv2 and Iw2. The structure and operation of the phase angle estimation part 160 will be explained later in detail.

Figure 4:
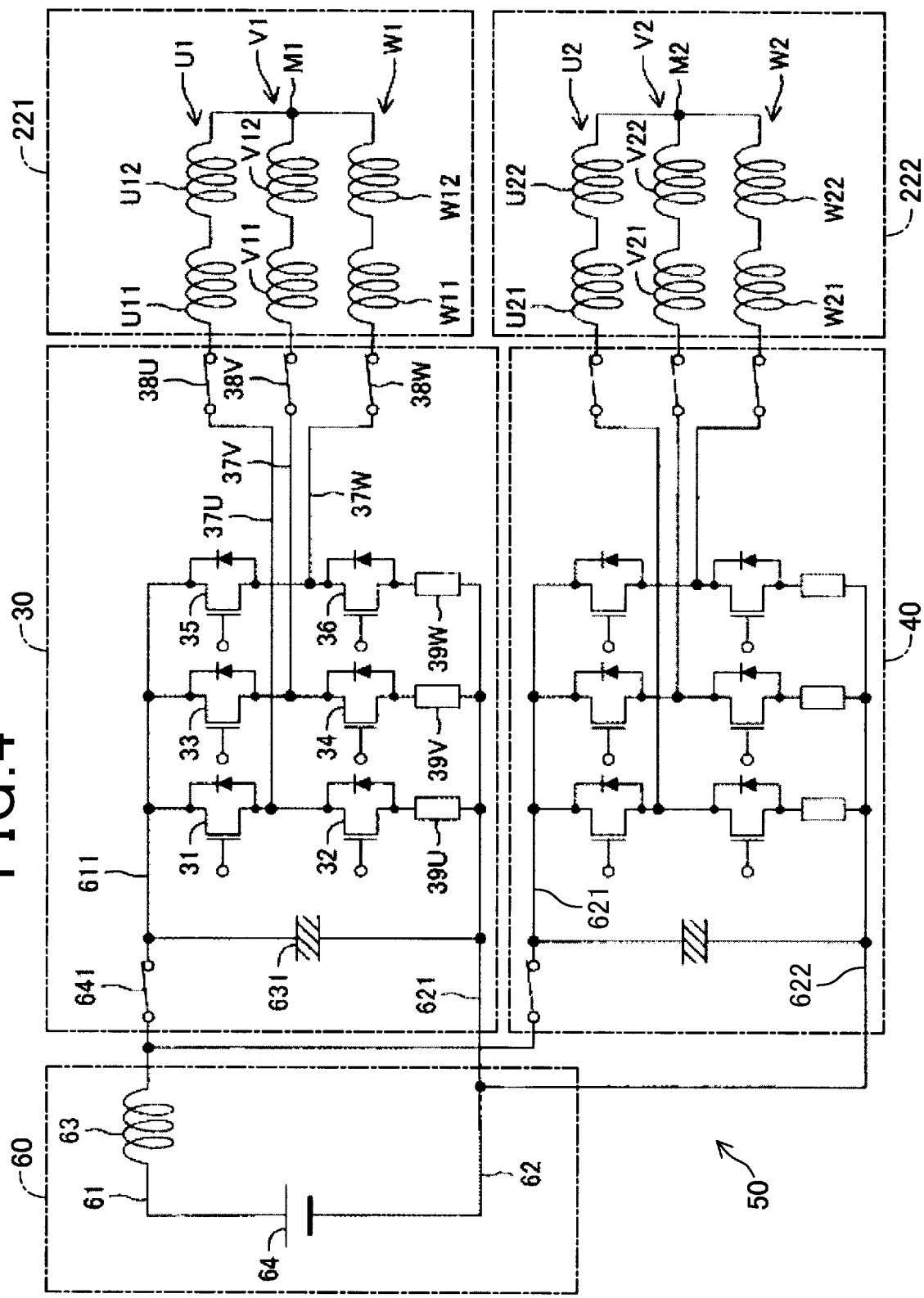
FIG. 4 is a view showing a first drive circuit and a second drive circuit in a motor drive unit in the drive control part of the rotating electric machine according to the present invention shown in FIG. 1.

FIG. 4 is a view showing the first drive circuit 30 and the second drive circuit 40 in the motor drive unit 50 in the drive control part 300 of the rotating electric machine 400 according to the present invention shown in FIG. 1.

As shown in FIG. 4, the motor drive unit 50 has a direct current (DC) power source 60 in addition to the first drive circuit 30 and the second drive circuit 40. The first drive circuit 30 drives the first coil 221. The second drive circuit 40 drives the second coil 222. As previously described, the first coil 221 is composed of the first U phase coil U1, the first V phase coil V1 and the first W phase coil W1 of the first three phase winding in the first system. The second coil 222 is composed of the second U phase coil U2, the second V phase coil V2 and the second W phase coil W2 of the second three phase winding in the second system.

As shown in FIG. 4, the first U phase coil U1, the first V phase coil V1 and the first W phase coil W1 in the first system, i.e. in the first coil 212 are electrically connected at the neutral point M1. The second U phase coil U2, the second V phase coil V2 and the second W phase coil W2 in the second system, i.e. in the second coil 222 are electrically connected at the neutral point M2.

The DC power source 60 has a battery 64 and a smoothing coil 63. The battery 64 is connected between a main power source line 61 and a main ground line 62. The smoothing coil 63 is arranged on the main power source line 61.

As shown in FIG. 4, a first power source line 611 in the first drive circuit 30 and a second power source line 612 in the second drive circuit 40 are branched from the main power source line 61. A first ground line 621 in the first drive circuit 30 and a second ground line 622 in the second drive circuit 40 are branched from the main ground line 62.

The structure and operation of the first drive circuit 30 will be explained because the first drive circuit 30 and the second drive circuit 40 have the same structure.

As shown in FIG. 4, the first drive circuit 30 is a three phase inverter circuit composed of six switching elements, i.e. a first switching element 31, a second switching element 32, a third switching element 33, a fourth switching element 34, a fifth switching element 35 and a sixth switching element 36. For example, each of these switching circuits 31 to 36 is composed of a metal oxide semiconductor field effect transistor (MOS FET). The first switching element 31 and the second switching element 32 are connected in series. Similarly, the third switching element 33 and the fourth switching element 34 are connected in series. The fifth switching element 35 and the sixth switching element 36 are connected in series.

As shown in FIG. 4, a connection node between the first switching element 31 and the second switching element 32 is connected to the first U phase coil U1 through a first U phase electric power supply line 37U.

Similarly, a connection node between the third switching element 33 and the fourth switching element 34 is connected to the first V phase coil V1 through a first V phase electric power supply line 37V.

A connection node between the fifth switching element 35 and the sixth switching element 36 is connected to the first W phase coil W1 through a first W phase electric power supply line 37W.

A phase open relay 38U is mounted on the first U phase electric power supply line 37U. A phase open relay 38V is mounted on the first V phase electric power supply line 37V. A phase open relay 38W is mounted on the first W phase electric power supply line 37W.

The open state of the phase open relay 38U, the phase open relay 38V and the phase open relay 38W prohibits electric power supply to the first coil 221.

A shunt resistance 39U is arranged between the first ground line 621 and the second switching switch 32. A shunt resistance 39V is arranged between the first ground line 621 and the fourth switching switch 34. A shunt resistance 39W is arranged between the first ground line 621 and the sixth switching switch 36.

The first current sensor 71 (see FIG. 1) detects a voltage between both terminals of the shunt resistance 39U so as to obtain a current Iu1 flowing in the first U phase coil U1. Similarly, the first current sensor 71 detects a voltage between both terminals of the shunt resistance 39V so as to obtain a current Iv1 flowing in the first V phase winding V1. The first current sensor 71 detects a voltage between both terminals of the shunt resistance 39W so as to obtain a current Iw1 flowing in the first W phase winding W1.

A smoothing capacitor 631 is connected between the first power source line 611 and the first ground line 621. A power source relay 641 is arranged on the first power source line 611. The power source relay 641 is turned on/on when receiving an open/close control signal transmitted from the control part 100.

A gate of each of the first to sixth switching elements 31 to 36 in the first drive circuit 30 receives the corresponding switching signal Su1, Sv1, Sw1 (see FIG. 3) transmitted form the control part 100. A duty ratio of the voltage to be supplied to the first coil 221 is adjusted on the basis of the switching signals Su1, Sv1 and Sw1. This makes it possible to adjust the drive voltage to the target voltage.

Figure 5:
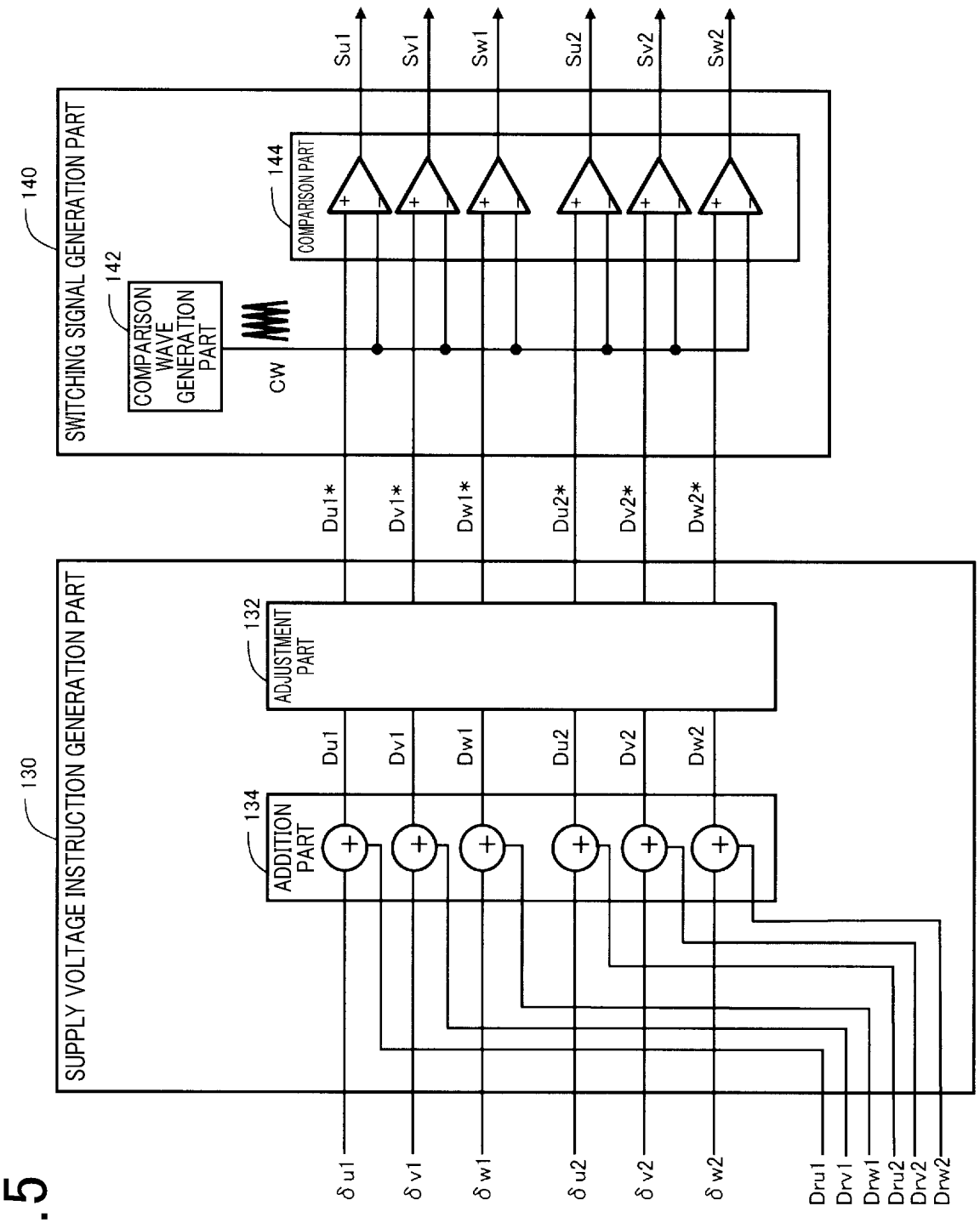
FIG. 5 is a block diagram of a supply voltage instruction generation part and a switching signal generation part in the control part in the rotating electric machine according to the present invention shown in FIG. 1.

FIG. 5 is a block diagram of the supply voltage instruction generation part 130 and the switching signal generation part 140 in the control part 100 of the rotating electric machine 400 according to the present invention shown in FIG. 1.

As shown in FIG. 5, the supply voltage instruction generation part 130 has an adjustment part 132 and an addition part 134.

The addition part 134 adds the external disturbance voltage instruction signals δu1, δv1, δw, 1δu2, δv2 and δw2 and the drive voltage instruction signals Dru1, Drv1, Drw1, Dru2, Drv2 and Drw2 so as to generate the supply voltage instruction signals Du1, Dv1, Dw1, Du2, Dv2 and Dw2, respectively.

The adjustment part 132 adjusts a signal level of each of the supply voltage instruction signals Du1, Dv1, Dw1, Du2, Dv2 and Dw2 to the adjusted supply voltage instruction signals Du1*, Dv1*, Dw1*, Du2*, Dv2* and Dw2*, respectively.

The adjustment part 132 performs the level adjustment of each of the supply voltage instruction signals Du1, Dv1, Dw1, Du2, Dv2 and Dw2 so as to reduce a timing difference between the corresponding line external disturbance voltages of the phase coils in the first coil 221 and the second coil 222 (i.e. in the first system and the second system of the windings) more than the time difference between them without performing the level adjustment. The level adjustment of each of the supply voltage instruction signals will be explained later.

The switching signal generation part 140 has a comparison wave generation part 142 and a comparison part 144. The comparison wave generation part 142 generates a pulse width modulation (PWM) comparison wave CW (as a carrier wave). For example, the comparison wave generation part 142 generates as the carrier wave CW a triangle wave, a saw tooth wave. The comparison part 144 compares the adjusted supply voltage instruction signals Du1*, Dv1*, Dw1*, Du2*, Dv2* and Dw2* with a PWM comparison wave CW so as to generate the switching signals Su1, Sv1, Sw1, Su1, Sv2 and Sw2.

Figure 6:
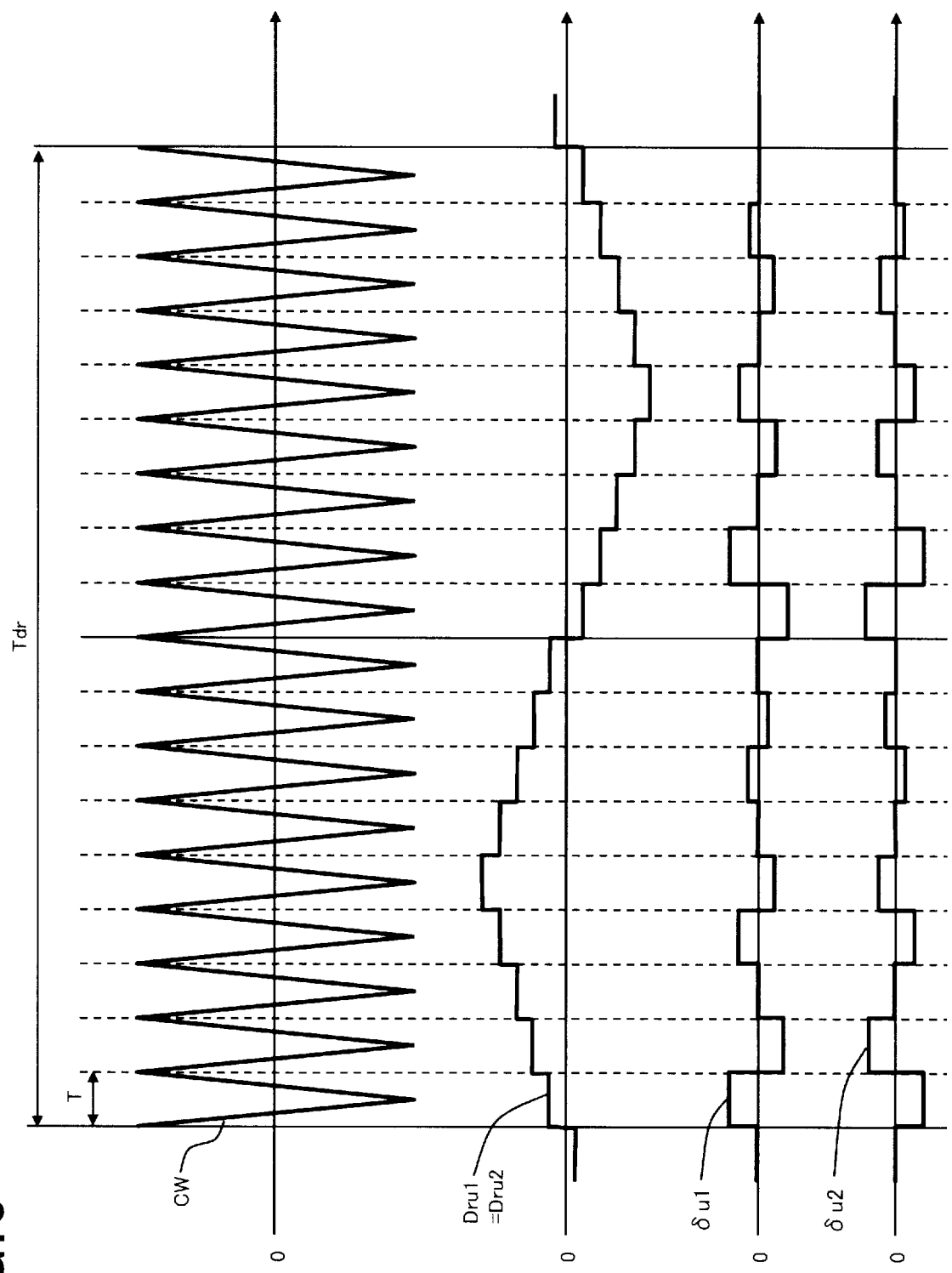
FIG. 6 is a timing chart showing a PWM comparison wave, drive voltage instruction signals and external disturbance voltage instruction signals generated by the control part of a drive control part in the rotating electric machine according to the present invention shown in FIG. 1.

FIG. 6 is a timing chart showing the PWM comparison wave CW, the drive voltage instruction signals and the external disturbance voltage instruction signals generated by the control part 100 of the drive control part 300 in the rotating electric machine 400 according to the present invention shown in FIG. 1.

As shown in FIG. 6, one drive period Tdr is composed of a plurality of PWM periods T. The one drive period Tdr corresponds to an electrical angle of 2n. The drive voltage instruction signals Dru1, Dru2 to be used for the first three phase winding in a first system and the second three phase winding in the second system. As previously described, the first three phase windings is composed of the first U phase coil U1, the first V phase coil V1 and the first W phase coil W1. The second three phase windings is composed of the second U phase coil U2, the second V phase coil V2 and the second W phase coil W2. As shown in FIG. 6, the drive voltage instruction signals Dru1, Dru2 correspond to the sine wave signal in the one drive period Tdr.

In particular, it is preferable for the drive voltage instruction signals Dru1, Dru2 to have the same waveform during the one drive period Tdr. It is acceptable for the drive voltage instruction signals Dru1, Dru2 to have another wave form instead of the sine waveform. For example, it is acceptable for each of the drive voltage instruction signals Dru1, Dru2 to have a different value.

The external disturbance voltage instruction signal δu1 of the first U phase coil U1 has a plurality of pulse voltage instruction signals during the one drive period Tdr. In the first exemplary embodiment, each pulse voltage instruction signal has a rectangle waveform. The number of the pulse voltage instruction signals in the one drive period Tdr is six. One pulse voltage instruction signal is in the two PWM periods T, a first half period T in the two PWM periods T has a positive value, and the latter half thereof is a negative value.

It is preferable for a plurality of the pulse voltage instruction signals of the external disturbance voltage instruction signal δu1 to be separated from each other (which contain a period having its zero instruction value). That is, this makes it possible to add the external disturbance voltage to each of the pulse voltage instruction signals, and to correctly detect an external disturbance current due to the external disturbance voltage.

It is preferable to have an absolute value of the external disturbance voltage instruction signal δu1 which is adequately smaller than the drive voltage instruction signal Dru1, Dru2 to be used form generating the motor torque of the motor 200. In the example shown in FIG. 6, the external disturbance voltage instruction signal δu2 of the second U phase coil U2 is opposite in sign of the external disturbance voltage instruction signal δu1, and has the same absolute value of the external disturbance voltage instruction signals but of the first U phase coil U1.

The external disturbance voltage instruction signals δv1, δv2, δw1, δw2 have the same relationship of the external disturbance voltage instruction signals δu1, δv2 of the first U phase coil U1 previously described. In other words, the external disturbance voltages having a different phase of 180 degrees are supplied into the first coil 221 and the second coil 222, i.e. the three phase windings in the first system and the second system. It is acceptable to use the external disturbance voltage instruction signal δu1 and the external disturbance voltage instruction signal δu2 having a different absolute value thereof.

In view of reduction of noise due to the external disturbance voltage, it is preferable for the external disturbance voltage instruction signal δu1 and the external disturbance voltage instruction signal δu2 to have the same absolute value and an opposite sign from each other.

The vertical axis in FIG. 6 represents a modulation ratio of each of the drive voltage instruction signals Dru1, Dru2 and the external disturbance voltage instruction signals δu1, δu2. The modulation ratio is changed within a range of 0 to 100%. Examples of the external disturbance voltage instruction signals to be used for three phase windings of the first coil 221 and the second coil 222 will be explained later.

Figure 7:
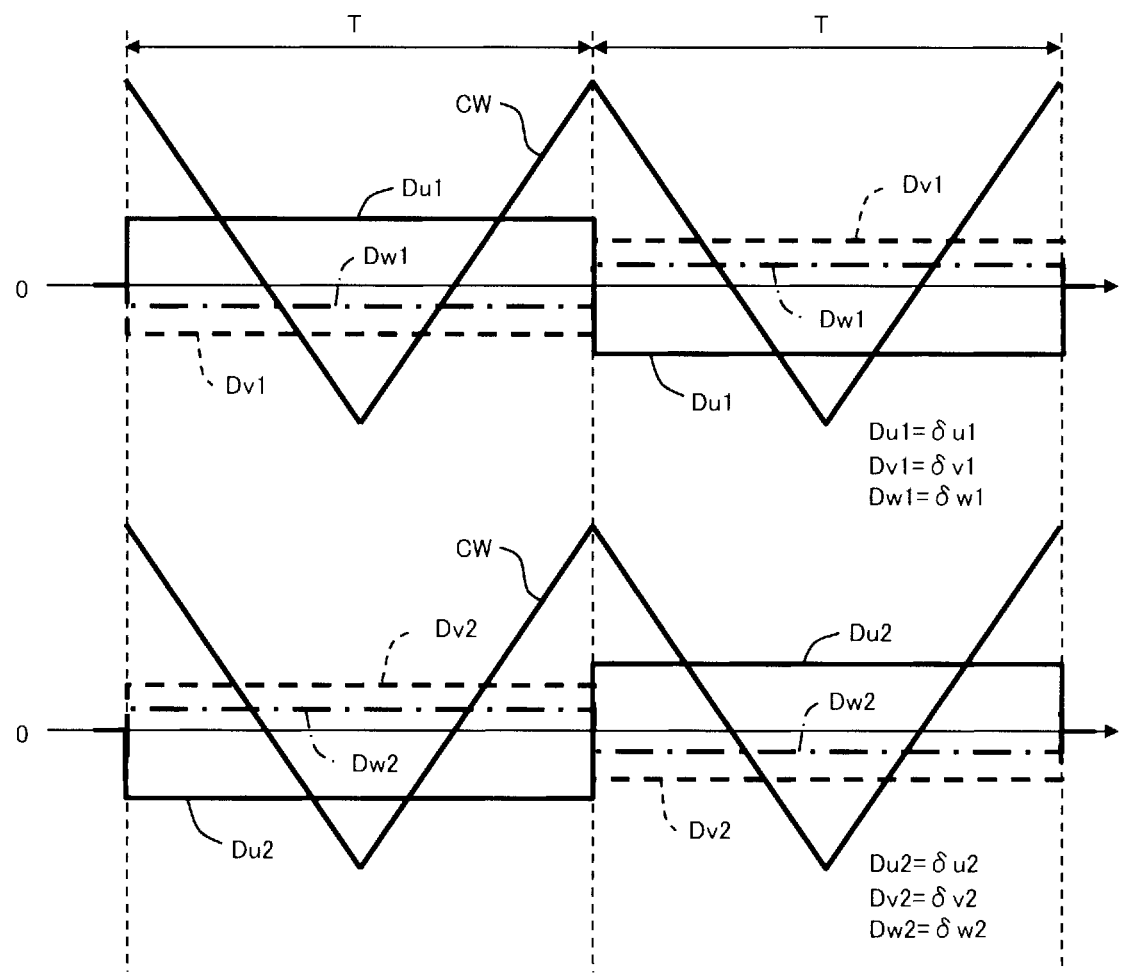
FIG. 7 is a timing chart showing a relationship between supply voltage instruction signals and external disturbance voltage instruction signals used in a rotating electric machine according to a comparative example.
Figure 8A:
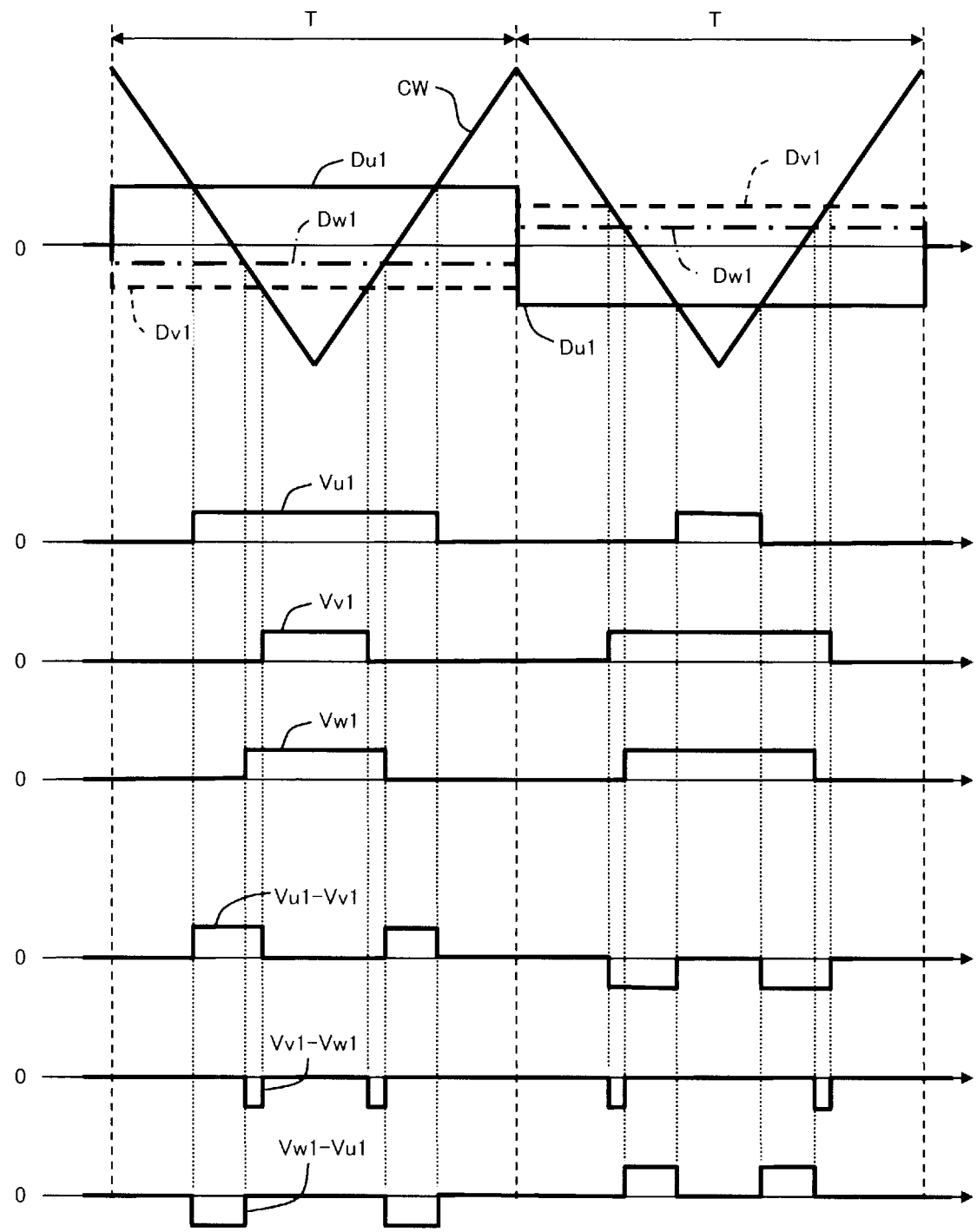
FIG. 8A is a timing chart showing a relationship between phase voltages and line external disturbance voltages generated in a first coil of a stator of the rotating electric machine according to the comparative example.
Figure 8B:
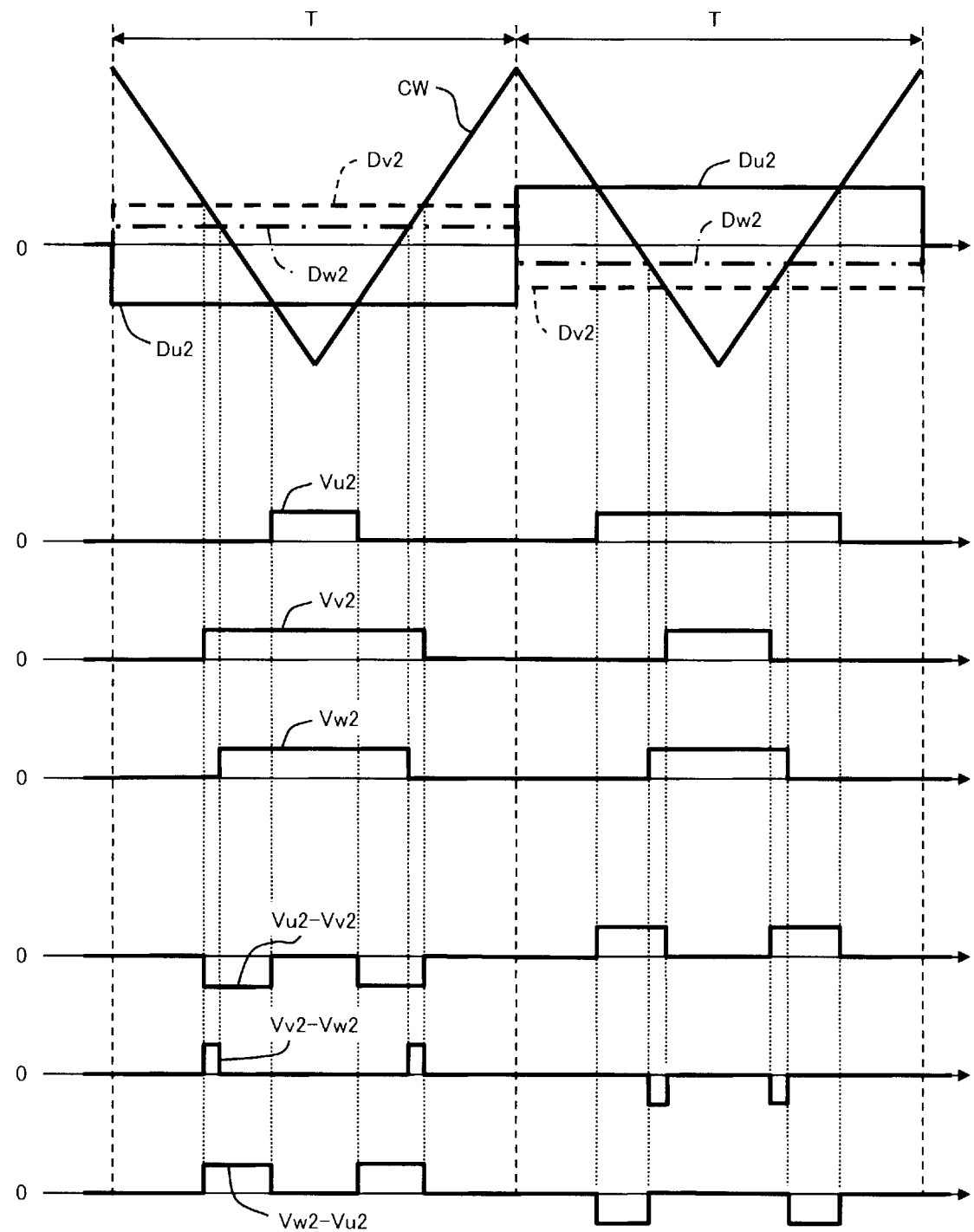
FIG. 8B is a timing chart showing a relationship between phase voltages and line external disturbance voltages generated in a second coil of the stator of the rotating electric machine according to the comparative example.
Figure 8C:
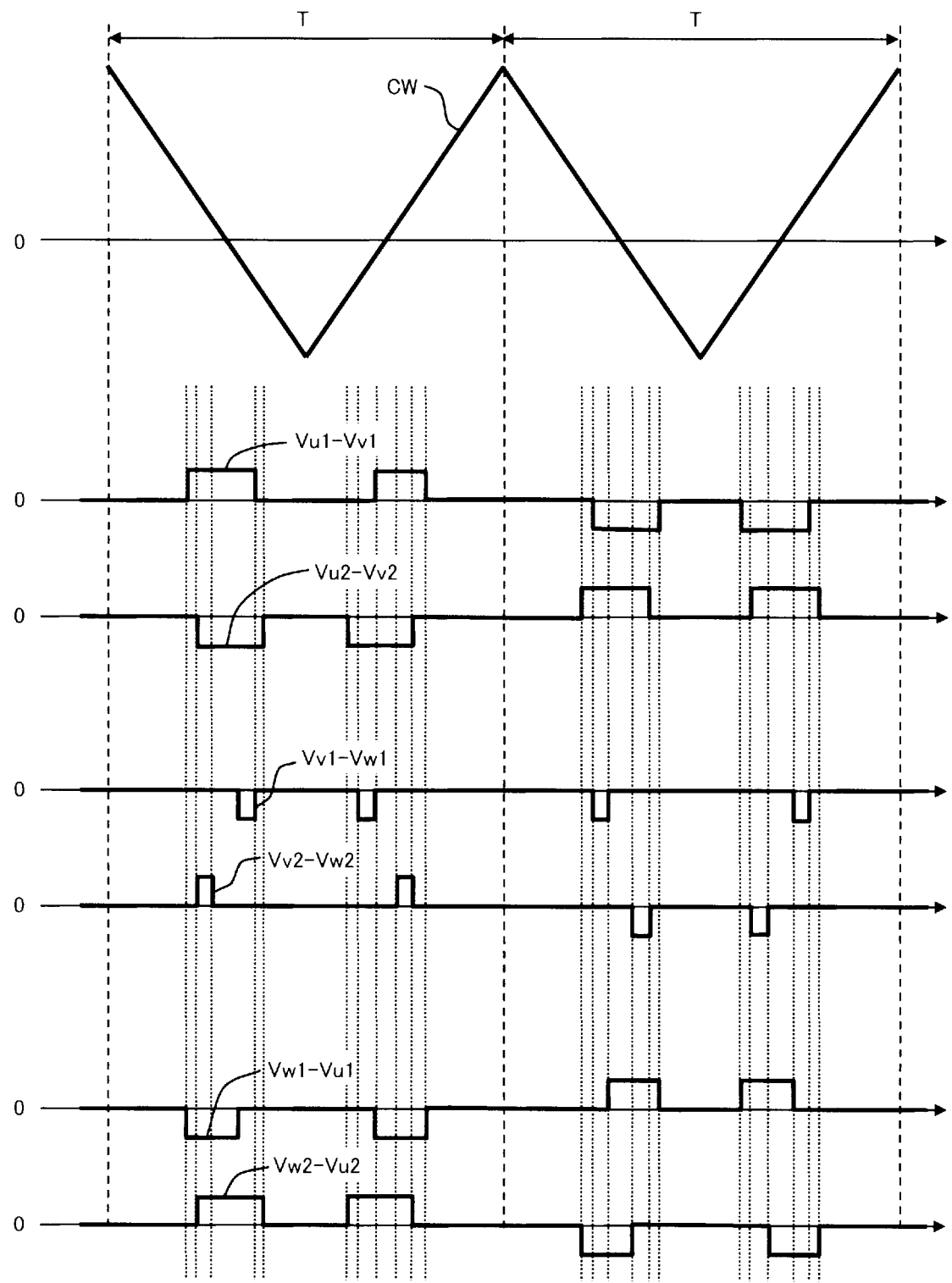
FIG. 8C is a timing chart showing a comparison between the line external disturbance voltages generated in the first coil and the second coil of the stator of the rotating electric machine according to the comparative example.

FIG. 7 is a timing chart showing a relationship between supply voltage instruction signals and external disturbance voltage instruction signals used in a rotating electric machine according to a comparative example. FIG. 8A is a timing chart showing a relationship between phase voltages and line external disturbance voltages generated in the first coil 221 of the stator 220 of the rotating electric machine according to the comparative example. FIG. 8B is a timing chart showing a relationship between phase voltages and line external disturbance voltages generated in the second coil 222 of the stator 220 of the rotating electric machine according to the comparative example. FIG. 8C is a timing chart showing a comparison between the line external disturbance voltages generated in the first coil 221 and the second coil 222 of the stator 220 of the rotating electric machine according to the comparative example.

A description will now be given of a case in which the rotor 210 is stopped and the drive voltage instruction signal is zero. It is possible to substantially have the same explanation when the drive voltage instruction signal is non-zero.

In the comparative example shown in FIG. 8A, FIG. 8B and FIG. 8C, the external disturbance voltage instruction signals δu1, δv1, δw1, δu2, δv2 and δw2 (see FIG. 5) are directly transmitted as the supply voltage instruction signals Du1, Dv1, Dw1 Du2, Dv2 and Dw2 to the switching signal generation part 140 when the drive voltage instruction signal is zero. Accordingly, it is possible to estimate the phase angle of the rotor 210 without using the addition part 134 in the supply voltage instruction generation part 130 during the stopped state of the rotor 210.

FIG. 7 shows the comparative example using the supply voltage instruction signals Du1, Dv1 and Dw1 to be used for the first coil 221 and the supply voltage instruction signals Du2, Dv2 and Dw2 to be used form the second coil 222. As previously described, these supply voltage instruction signals Du1, Dv1, Dw1 Du2, Dv2 and Dw2 are equal to the external disturbance voltage instruction signals δu1, δv1, δw1, δu2, δv2 and δw2, respectively. Each of the supply voltage instruction signals Du1, Dv1, Dw1 Du2, Dv2 and Dw2 is changed during the two PWM periods T. Each supply voltage instruction signal has a positive value during one PWM period T, and has a negative value during the other PWM period in the two PWM periods T. Each supply voltage instruction signal during one PWM period has an absolute value which is the same as the absolute value of that during the other PWM period.

As shown in FIG. 8A, when phase voltages Vu1, Vv1 and Vw1 are supplied to the first coil 221 on the basis of the supply voltage instruction signals Du1, Dv1 and Dw1, a line external disturbance voltage (Vu1−Vv1) is generated between the U phase and the V phase on the basis of the phase voltages Vu1, Vv1, a line external disturbance voltage (Vu1 −Vw1) is generated between the U phase and the W phase on the basis of the phase voltages Vu1, Vw1, and a line external disturbance voltage (Vw1−Vu1) is generated between the W phase and the U phase on the basis of the phase voltages Vw1, Vu1.

Further, as shown in FIG. 8B, when phase voltages Vu2, Vv2 and Vw2 are supplied to the second coil 222 on the basis of the supply voltage instruction signals Du2, Dv2 and Dw2, a line external disturbance voltage (Vu2−Vv2) is generated between the U phase and the V phase on the basis of the phase voltages Vu2, Vv2, a line external disturbance voltage (Vu2−Vw2) is generated between the U phase and the W phase on the basis of the phase voltages Vu2, Vw2, and a line external disturbance voltage (Vw2−Vu2) is generated between the W phase and the U phase on the basis of the phase voltages Vw2, Vu2.

Because actual voltages to be supplied to the first coil 221 and the second coil 222 are these line external disturbance voltage, it is necessary to pay attention to the line external disturbance voltages more than the phase voltages. That is, the line external disturbance voltage (Vu2−Vv2), the line external disturbance voltage (Vu2−Vw2) and the line external disturbance voltage (Vw2−Vu2) correspond to the actual external disturbance pulse voltages, respectively.

As shown in FIG. 8C, the line external disturbance voltages between the first coil 221 and the second coil 222 of the stator are shifted in turn-on timing and turn-off timing from each other. Accordingly, the generation timing of the external disturbance current caused by the line external disturbance voltage is also shifted, and noise is also generated due to the shifted generation timing of the external disturbance current.

Figure 9:
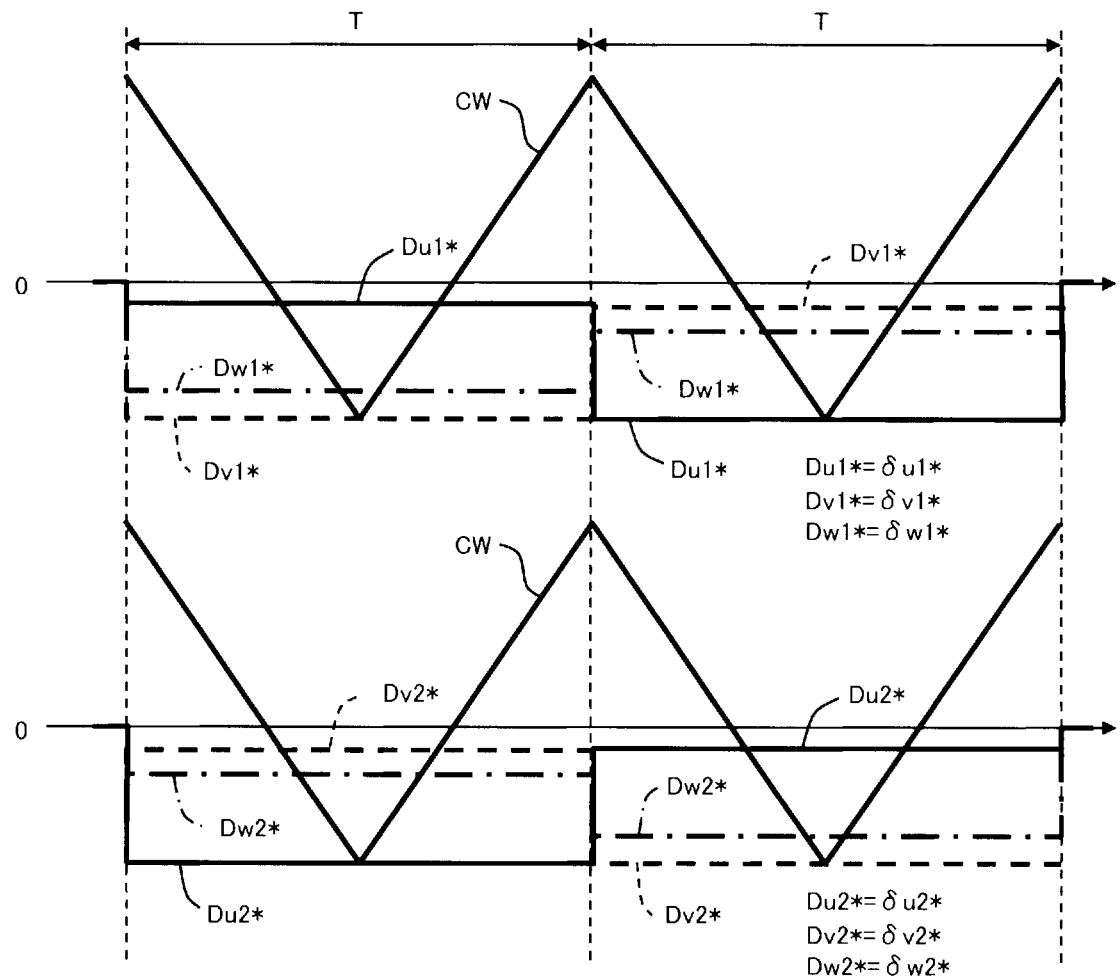
FIG. 9 is a timing chart showing adjusted supply voltage instruction signals to be used in the rotating electric machine according to a first exemplary embodiment of the present invention.

FIG. 9 is a timing chart showing adjusted supply voltage instruction signals to be used in the rotating electric machine according to a first exemplary embodiment of the present invention.

As shown in FIG. 9, the adjusted supply voltage instruction signals Du1*, Dv1* and Dw1* to be used for the first coil 221 are adjusted by the adjustment part 132 so that a voltage level difference between the supply voltage instruction signals Du1, Dv1 and Dw1 before the level adjustment is maintained in each PWM period T and the minimum voltage level thereof is equal to the minimum level of the PWM comparison wave CW.

Similarly, the adjusted supply voltage instruction signals Du2*, Dv2* and Dw2*, to be used for the second coil 222 are adjusted by the adjustment part 132 so that a voltage level difference between them before the adjustment is maintained during each PWM period T and the minimum voltage level thereof is equal to the minimum level of the PWM comparison wave CW.

Further, it is assumed in the case shown in FIG. 9 in which the rotor 210 is stopped and each drive voltage instruction signal is zero. Accordingly, the adjusted supply voltage instruction signals Du1*, Dv1*, Dw1*, Du2*, Dv2* and Dw2* after the level adjustment are equal to the adjusted external disturbance voltage instruction signals δu1*, δv1*, δw1*, δu2*, δv2* and δw2*, respectively. These adjusted external disturbance voltage instruction signals δu1*, δv1*, δw1*, δu2*, δv2* and δw2* have been obtained by adjusting the external disturbance voltage instruction signals δu1, δv1, δw1, δu2, δv2 and δw2.

Figure 10A:
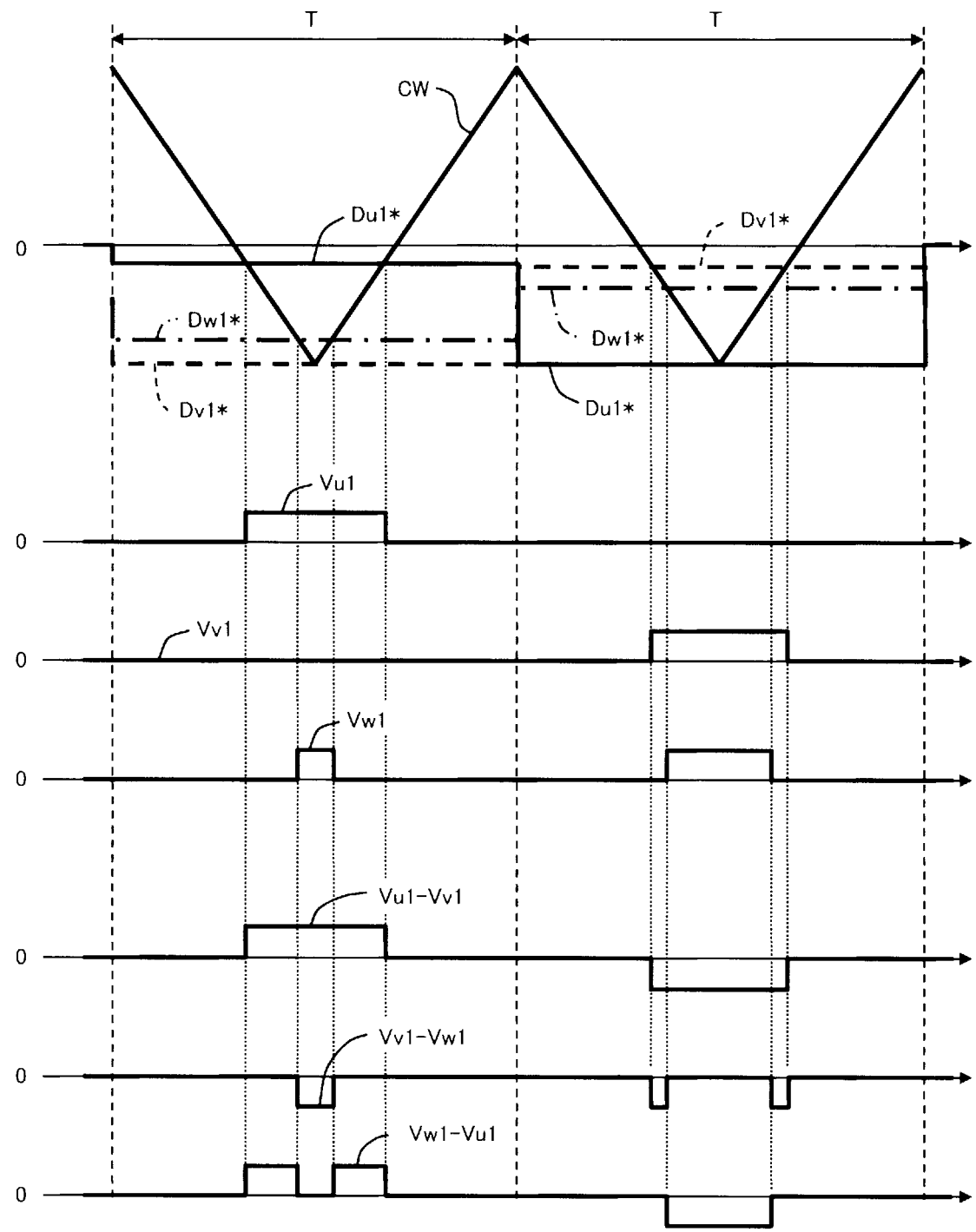
FIG. 10A is a timing chart showing a relationship between phase voltages and line external disturbance voltages generated in a first coil of a stator of the motor in the rotating electric machine according to the first exemplary embodiment of the present invention.
Figure 10B:
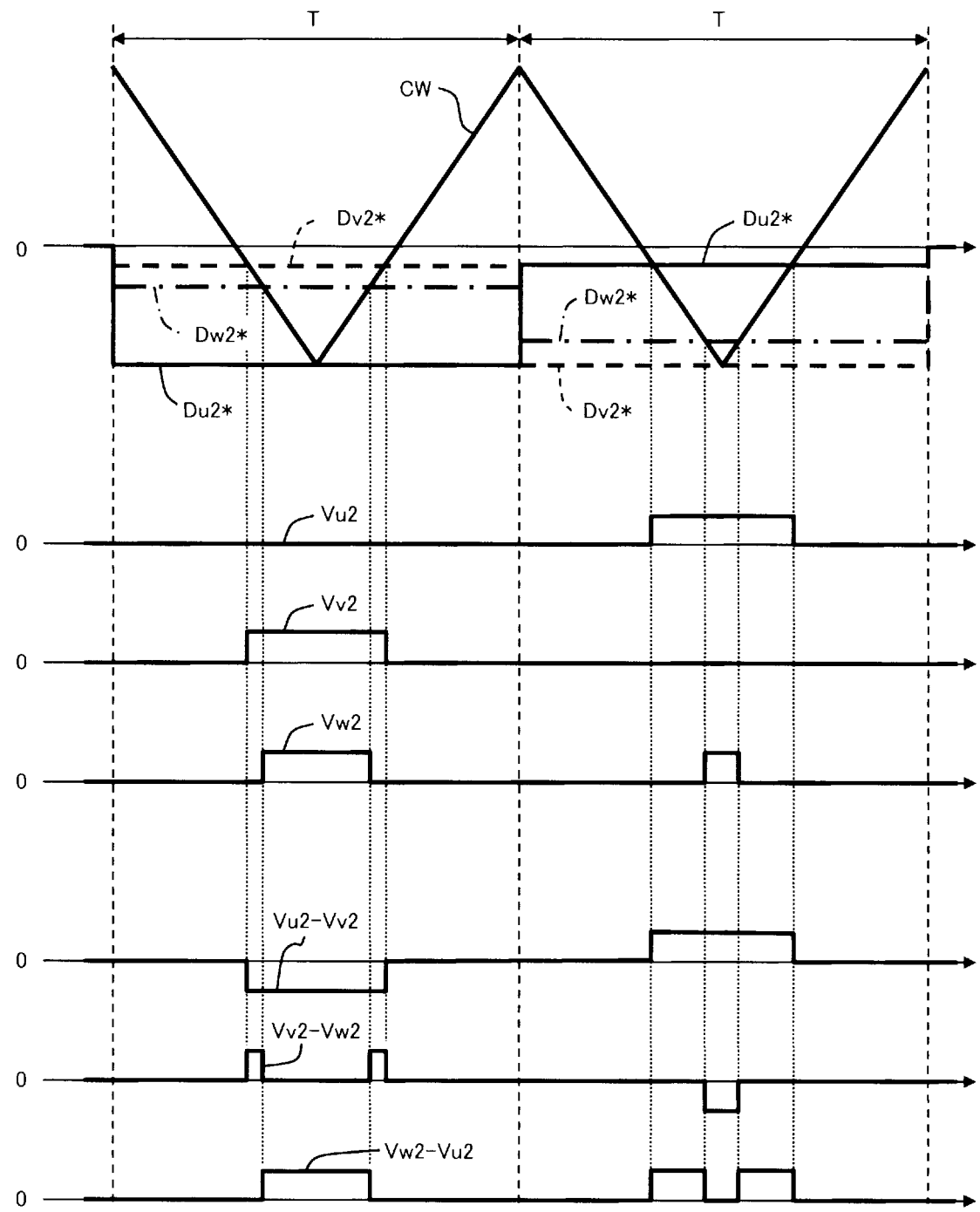
FIG. 10B is a timing chart showing a relationship between phase voltages and line external disturbance voltages generated in a second coil of the stator of the motor in the rotating electric machine according to the first exemplary embodiment of the present invention.
Figure 10C:
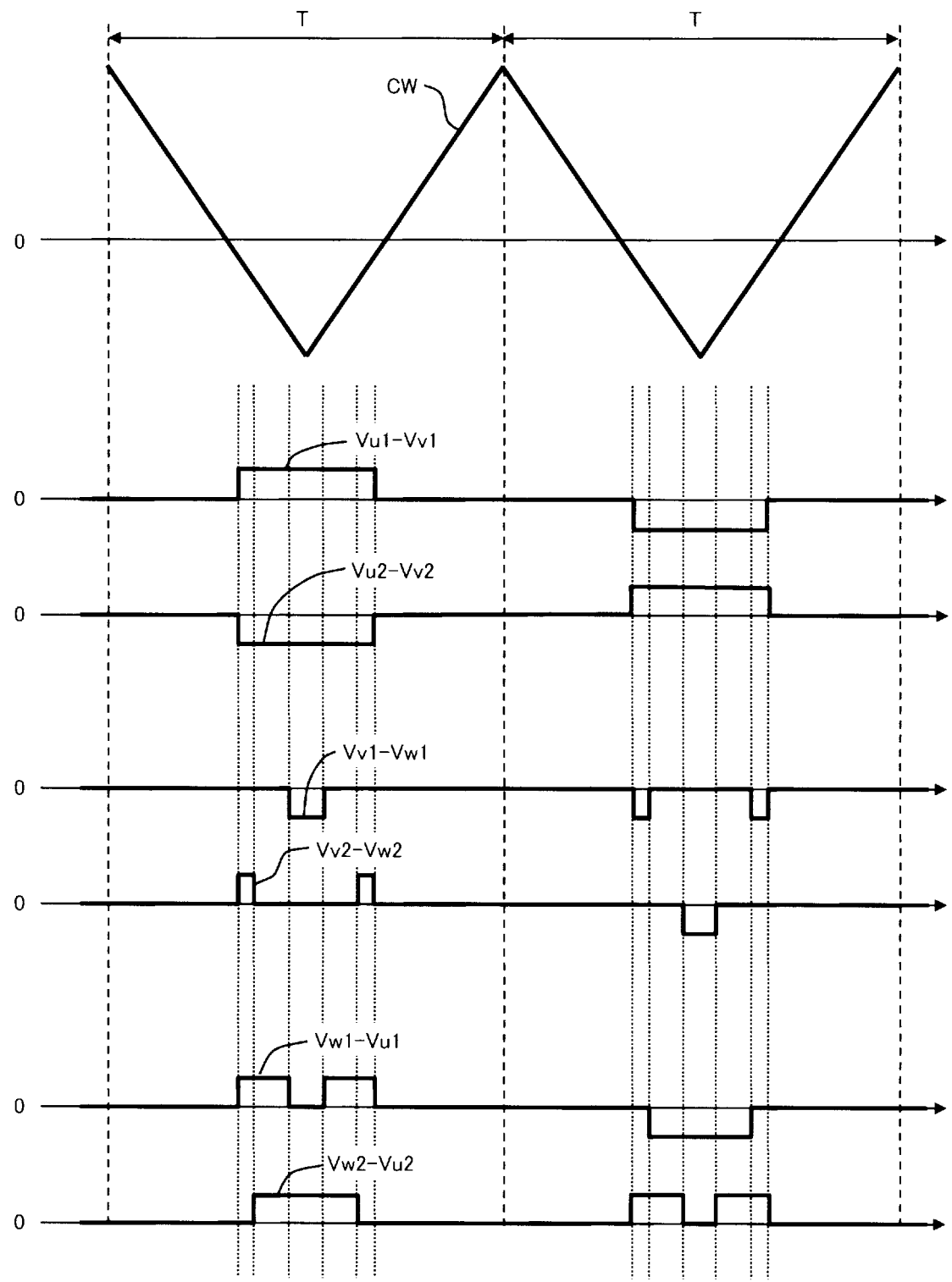
FIG. 10C is a timing chart showing a comparison between the line external disturbance voltages generated in the first coil and the second coil of the stator of the motor in the rotating electric machine according to the first exemplary embodiment of the present invention.

FIG. 10A is a timing chart showing a relationship between the phase voltages and line external disturbance voltages generated in the first coil 221 of the stator 220 of the motor 200 in the rotating electric machine 400 according to the first exemplary embodiment. FIG. 10B is a timing chart showing a relationship between phase voltages and line external disturbance voltages generated in the second coil 222 of the stator 220 of the motor 200 in the rotating electric machine 400 according to the first exemplary embodiment. FIG. 10C is a timing chart showing a comparison between the line external disturbance voltages generated in the first coil 221 and the second coil 222 of the stator 220 of the motor 200 in the rotating electric machine 400 according to the first exemplary embodiment.

As shown in FIG. 10A, the phase voltages Vu1, Vv1 and Vw1 are supplied to the first coil 221 of the stator 220 of the motor 200 on the basis of the adjusted supply voltage instruction signals Du1*, Dv1* and Dw1*. Further, the line external disturbance voltage (Vu1 −Vv1) is generated between the U phase and the V phase, the line external disturbance voltage (Vu1 −Vw1) is generated between the U phase and the W phase and the line external disturbance voltage (Vw1−Vu1) is generated between the W phase and the U phase on the basis of the phase voltages Vu1, Vv1 and Vw1.

Similarly, as shown in FIG. 10B, the phase voltages Vu2, Vv2 and Vw2 are supplied to the second coil 222 of the stator 220 of the motor 200 on the basis of the adjusted supply voltage instruction signals Du2*, Dv2* and Dw2*. Further, the line external disturbance voltage (Vu2−Vv2) is generated between the U phase and the V phase, the line external disturbance voltage (Vv2−Vw2) is generated between the V phase and the W phase, and the line external disturbance voltage (Vw2−Vu2) is generated between the W phase and the U phase on the basis of the phase voltages Vu2, Vv2 and Vw2.

As shown in FIG. 10C, the line external disturbance voltages to be generated in the first coil 221 and the second coil 222 have the same generation timing when compared with the generation timing in the comparative case shown in FIG. 8C.

In particular, as shown in FIG. 10C, the line external disturbance voltage (Vu1 −Vv1) generated between the U phase and the V phase of the first coil 221 and the line external disturbance voltage (Vu2−Vv2) generated between the U phase and the V phase of the second coil 222 have the same turn-on (rising) timing and the same turn-off (falling) timing without any difference. This makes it possible to reduce noise. In the case shown in FIG. 10C, because the line external disturbance voltage (Vu1 −Vv1) generated between the U phase and the V phase is larger than each of the line external disturbance voltage (Vu1 −Vw1) and the line external disturbance voltage (Vw1−Vu1), it is possible to drastically reduce noise when the line external disturbance voltages (Vu1 −Vv1), (Vu2−Vv2) generated between the U phase and the V phase in the first coil 221 and the second coil 222 have the same generation timing.

As clearly understood when comparing the case after the level adjustment shown in FIG. 10C with the comparative case before the level adjustment shown in FIG. 8C during one PWM period T have the same duty ratio of the line external disturbance voltage (Vu1 −Vv1). Similarly, the line external disturbance voltage (Vv1−Vw1) and the line external disturbance voltage (Vw1−Vu1) have the same feature.

As previously described, in the improved structure of the rotating electric machine 400 according to the first exemplary embodiment, the adjustment part 132 in the supply voltage instruction generation part 130 of the control part 100 (see FIG. 5) adjusts the voltage signal level of each of the supply voltage instruction signals Du1, Dv1, Dw1, Du2, Dv2 and Dw2 so as to generate adjusted supply voltage instruction signals Du1*, Dv1*, Dw1*, Du2*, Dv2* and Dw2* to be supplied to the first coil 221 and the second coil 222 of the stator 220 of the motor 200. This level adjustment of the supply voltage instruction signals makes it possible to drastically reduce the timing difference between the line external disturbance voltages in the first coil 221 and the second coil 222 of the three phase windings of the stator 220 more than the time difference between them without performing the level adjustment. As a result, this makes it possible to obtain the optimum voltage balance caused by the supply of the external disturbance voltages, and to reduce noise caused by the addition of the line external disturbance voltages. That is, it is possible to consider for the adjustment part 132 to reduce a timing difference between the line external disturbance voltages of the first coil 221 (as the first system) and the second coil 222 (as the second system) of the stator 220 of the motor 200.

In particular, in the structure of the rotating electric machine 400 according to the first exemplary embodiment, the control part 100 adjusts the supply voltage instruction signals so that the minimum voltage levels of the supply voltage instruction signals have the same value during the adjacent two PWM periods while maintaining the voltage level difference between the supply voltage instruction signals before the level adjustment for the three phase windings in the first system and the second system of the motor 200. This control makes it possible to reduce noise due to the line external disturbance voltages.

As shown in FIG. 9, the minimum voltage instruction signal in the three supply voltage instruction signals is adjusted to the minimum level of the PWM comparison wave CW. However, the concept of the present invention is not limited by this. It is acceptable to adjust it to another level instead of the minimum level of the PWM comparison wave CW.

Further, in the structure of the rotating electric machine 400 according to the first exemplary embodiment, the line external disturbance voltage (Vu1 −Vv1) between the U phase and the V phase in the first coil 221 and the line external disturbance voltage (Vu2−Vv2) between the U phase and the V phase in the second coil 222 have the same turn-on timing and turn-off timing.

The concept of the present invention is not limited by this. It is acceptable to adjust them to have one of the same turn-on timing and the same turn-off timing. However, in order to drastically reduce noise, it is most preferred for the line external disturbance voltage (Vu1 −Vv1) between the U phase and the V phase in the first coil 221 and the line external disturbance voltage (Vu2−Vv2) between the U phase and the V phase in the second coil 222 to have the same turn-on timing and turn-off timing.

As clearly understood from the description previously described, it is preferred for the line external disturbance voltages of the three phase windings of the first system and the second system to have the same timing. This means that it is preferable for at least one of the three line external disturbance voltages of the three phase windings to have at least one of the same turn-on timing and the same turn-off timing.

Second Exemplary Embodiment

Figure 11:
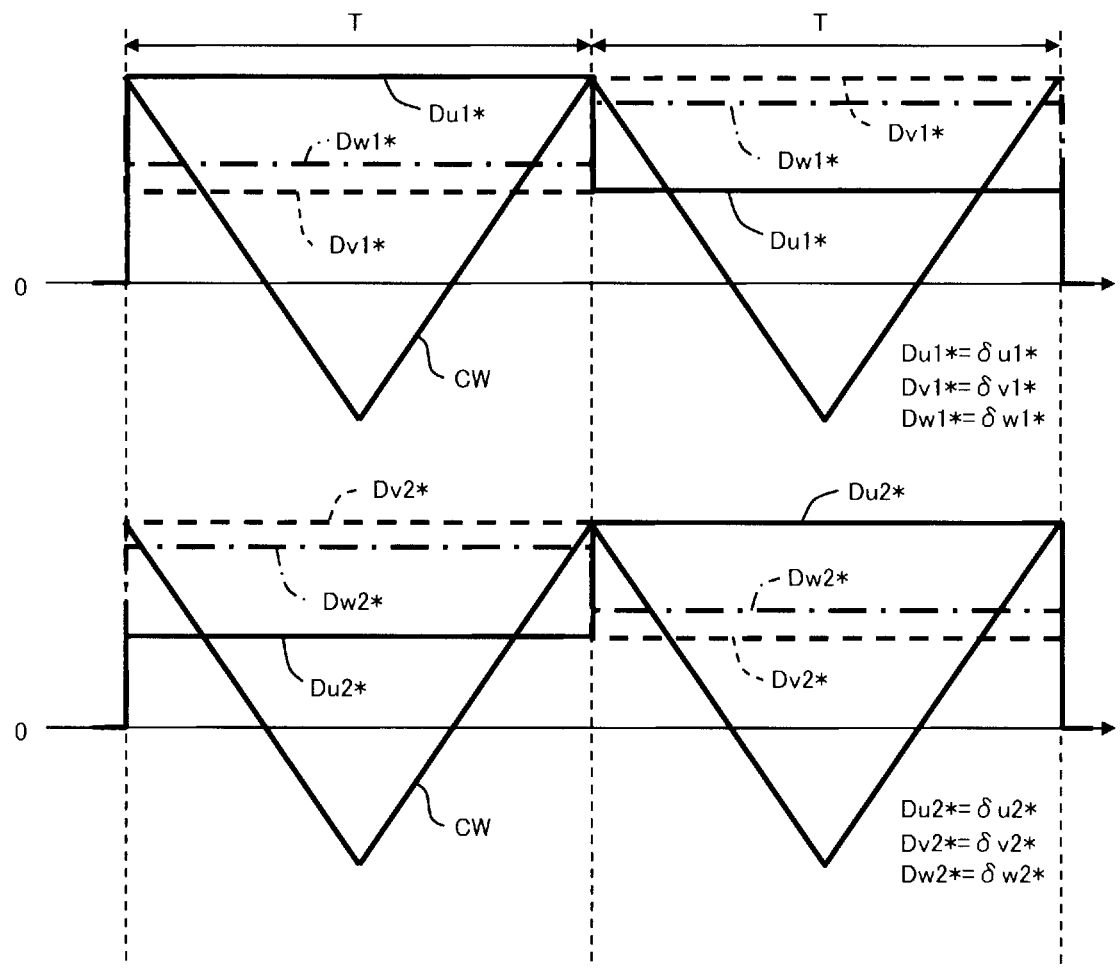
FIG. 11 is a timing chart showing a relationship between adjusted supply voltage instruction signals and PWM comparison wave CW to be used in the rotating electric machine according to a second exemplary embodiment of the present invention.

A description will be given of the rotating electric machine according to the second exemplary embodiment with reference to FIG. 11. FIG. 11 is a timing chart showing a relationship between adjusted supply voltage instruction signals and the PWM comparison wave CW to be used in the rotating electric machine according to the second exemplary embodiment of the present invention.

As shown in FIG. 11, in the structure of the rotating electric machine according to the second exemplary embodiment, the adjustment part 132 adjusts the supply voltage instruction signals Du1, Dv1 and Dw1 to the adjusted supply voltage instruction signals Du1*, Dv1* and Dw1*, to be used for the first coil 221 so that the maximum supply voltage instruction signal therein is equal to the maximum PWM comparison wave CW in each PWM period T while maintaining the voltage level difference between the supply voltage instruction signals Du1, Dv1 and Dw1 before the level adjustment.

Similarly, the adjustment part 132 adjusts the supply voltage instruction signals Du2, Dv2 and Dw2 to the adjusted supply voltage instruction signals Du2*, Dv2*, Dw2*, Du2*, Dv2* and Dw2*, to be used for the second coil 222 so that the maximum supply voltage instruction signal therein is equal to the adjusted supply voltage instruction signal D during each PWM period T while maintaining the voltage level difference between the supply voltage instruction signals Du2, Dv2 and Dw2 before the level adjustment.

The difference between the second exemplary embodiment and the first exemplary embodiment is a voltage level of the adjusted supply voltage instruction signals Du1*, Dv1*, Dw1*, Du2*, Dv2* and Dw2* after the level adjustment only. Because the rotating electric machines according to the second exemplary embodiment and the first exemplary embodiment have the same structure and the same control operation, the explanation of the rotating electric machines according to the second exemplary embodiment is omitted here.

Similar to the line external disturbance voltages used in the first exemplary embodiment previously described, the line external disturbance voltages of the corresponding three phase windings to be used in the first coil 221 and the second coil 222 in the second exemplary embodiment have the same generation timing. On the other hand, the comparative example shown in FIG. 8C uses a different generation timing. The structure and control shown in the explanation of the second exemplary embodiment makes it possible to obtain the optimum voltage balance caused by the supply of the external disturbance voltages and to reduce noise caused by the addition of the line external disturbance voltages.

Third Exemplary Embodiment

Figure 12:
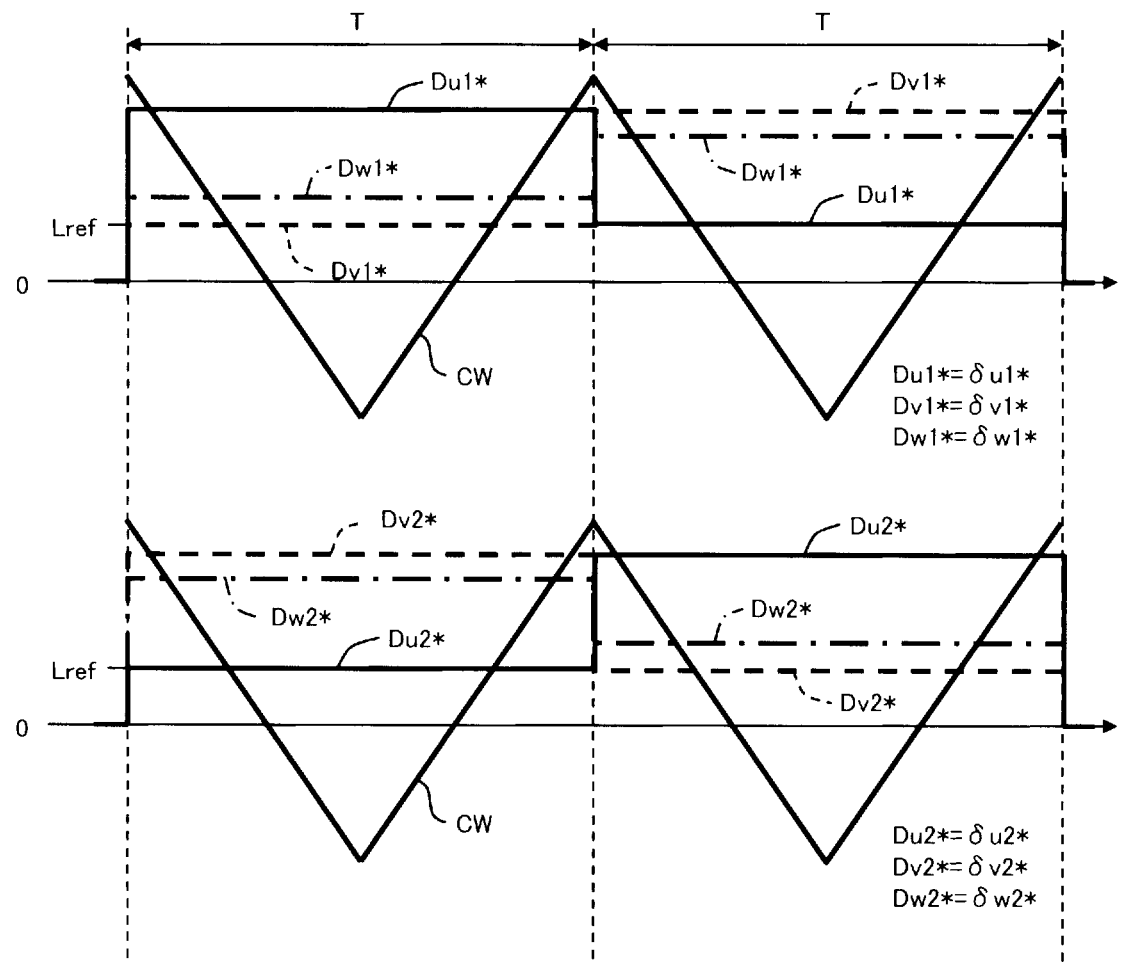
FIG. 12 is a timing chart showing a relationship between adjusted supply voltage instruction signals and the PWM comparison wave CW to be used in the rotating electric machine according to a third exemplary embodiment of the present invention.

A description will be given of the rotating electric machine according to the third exemplary embodiment with reference to FIG. 12. FIG. 12 is a timing chart showing a relationship between adjusted supply voltage instruction signals and the PWM comparison wave CW to be used in the rotating electric machine according to the third exemplary embodiment of the present invention.

As shown in FIG. 12, in the structure of the rotating electric machine according to the third exemplary embodiment, the adjustment part 132 (see FIG. 5) adjusts the supply voltage instruction signals Du1, Dv1 and Dw1 to the adjusted supply voltage instruction signals Du1*, Dv1* and Dw1*, respectively to be used for the first coil 221 so that the minimum supply voltage instruction signal therein is equal to a predetermined voltage level Lref between the maximum PWM comparison wave CW and the minimum PWM comparison wave CW in each PWM period T while maintaining the supply voltage instruction signals Du1, Dv1 and Dw1 before the level adjustment.

Similarly, the adjustment part 132 adjusts the supply voltage instruction signals Du2, Dv2 and Dw2 to the adjusted supply voltage instruction signals Du2*, Dv2* and Dw2*, respectively, to be used for the second coil 222 so that the minimum supply voltage instruction signal therein is equal to the predetermined voltage level Lref between the maximum PWM comparison wave CW and the minimum PWM comparison wave CW in each PWM period T The difference between the third exemplary embodiment and the first exemplary embodiment is the voltage level of the adjusted supply voltage instruction signals Du1*, Dv1*, Dw1*, Du2*, Dv2* and Dw2* after the level adjustment only. Because the rotating electric machines according to the third exemplary embodiment and the first exemplary embodiment have the same structure and the same control operation, the explanation of the rotating electric machines according to the third exemplary embodiment is omitted here.

Similar to the line external disturbance voltages used in the first exemplary embodiment previously described, the line external disturbance voltages of the corresponding three phase windings to be used in the first coil 221 and the second coil 222 in the third exemplary embodiment have the same generation timing. On the other hand, the comparative example shown in FIG. 8C uses a different generation timing. The structure and control shown in the explanation of the third exemplary embodiment makes it possible to obtain the optimum voltage balance caused by the supply of the external disturbance voltages and to reduce noise caused by the addition of the line external disturbance voltages.

Fourth Exemplary Embodiment

Figure 13:
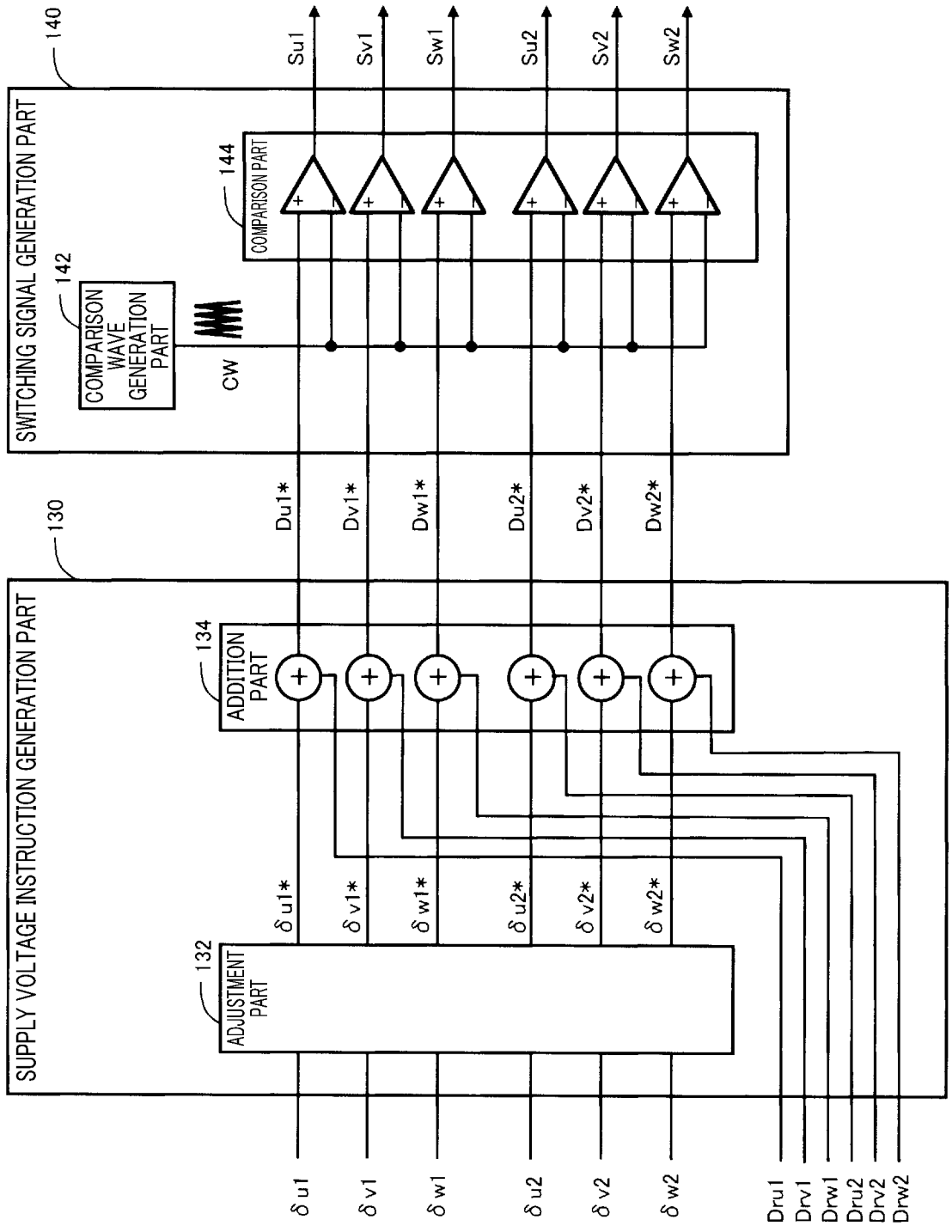
FIG. 13 is a block diagram showing a structure of a supply voltage instruction signal generation part and a switching signal generation part in the control part of the drive control part in the rotating electric machine according to the first exemplary embodiment of the present invention.

A description will be given of the rotating electric machine according to the fourth exemplary embodiment with reference to FIG. 13. FIG. 13 is a block diagram showing the structure of the supply voltage instruction signal generation part 130 and the switching signal generation part 140 in the control part 100 of the drive control part 300 in the rotating electric machine according to the fourth exemplary embodiment of the present invention. As shown in FIG. 13, the adjustment part 132 in the control part 100 adjusts a signal level of each of the external disturbance voltage instruction signals δu1, δv1, δw1, δu2, δv2 and δw2 to the adjusted external disturbance voltage instruction signals δu1*, δv1*, δw1*, δu2*, δv2* and δw2*. The addition part 134 adds the adjusted external disturbance voltage instruction signals δu1*, δv1*, θw1*, δu2*, δv2* and δw2* and the drive voltage instruction signals Dru1, Drv1, Drw1, Dru2, Drv2 and Drw2, respectively so as to generate the supply voltage instruction signals Du1*, Dv1*, Dw1*, Du2*, Dv2* and Dw2*.

Similar to the operation of the first exemplary embodiment shown in FIG. 5, the adjustment part 132 according to the fourth exemplary embodiment performs the level adjustment so as to drastically reduce a timing difference between the line external disturbance voltages in the first coil 221 and the second coil 222 of the three phase windings of the stator 220 more than the timing difference of them without performing the level adjustment.

In the structure of the control part 100 having the adjustment part 132 and the addition part 134 according to the first exemplary embodiment shown in FIG. 5 previously described, the adjustment part 132 performs the level adjustment of the supply voltage instruction signals Du1, Dv1, Dw1, Du2, Dv2 and Dw2, only.

On the other hand, in the structure of the control part 100 having the adjustment part 132 and the addition part 134 shown in FIG. 13 according to the fourth exemplary embodiment, the adjustment part 132 performs the level adjustment of the external disturbance voltage instruction signals but, δv1, δw1, δu2, δv2 and δw2, only. This level adjustment makes it possible for the level of the supply voltage instruction signals Du1*, Dv1*, Dw1*, Du2*, Dv2* and Dw2* to follow one of the cases shown in FIG. 9 (in the explanation of the first exemplary embodiment), the cases shown in FIG. 11 (in the explanation of the second exemplary embodiment), and the cases shown in FIG. 13 (in the explanation of the third exemplary embodiment), where these supply voltage instruction signals Du1*, Dv1*, Dw1*, Du2*, Dv2* and Dw2* have been obtained by adding the adjusted external disturbance voltage instruction signals δu1*, δv1*, δw1*, δu2*, δv2* and δw2* and the drive voltage instruction signals Dru1, Drv1, Drw1, Dru2, Drv2 and Drw2, respectively.

Further, it is preferable for the level adjustment by the adjustment part 132 according to the fourth exemplary embodiment to perform one of the level adjustment processes (i) and (ii) during the adjacent two PWM periods while maintaining the relative voltage level difference between the three external disturbance voltage instruction signals for the three phase windings in the first system and the second system of the motor 200:
(i) The level adjustment process to adjust the external disturbance voltage instruction signal having the minimum level in the three external disturbance voltage instruction signals; and
(ii) The level adjustment process to adjust the external disturbance voltage instruction signal having the maximum level in the three external disturbance voltage instruction signals.

It is more preferable to adjust the maximum value and the minimum value of the supply voltage instruction signals transmitted from the supply voltage instruction generation part 130 (see FIG. 3) to the switching signal generation part 140 to be within a range between the maximum level and the minimum level of the PWM comparison wave CW. The fourth exemplary embodiment have substantially the same effects of the first to third exemplary embodiments previously described.

As previously described, the adjustment part 132 according to the fourth exemplary embodiment shown in FIG. 13 reduces the timing difference between the line external disturbance voltages in the dual three phase windings in the first coil 221 and the second coil 222 of the stator 220 more than the timing difference of them without performing the level adjustment. As a result, this control makes it possible to obtain the optimum voltage balance caused by the supply of the external disturbance voltages and to reduce noise caused by the addition of the line external disturbance voltages. That is, it is possible for the adjustment part 132 to reduce a timing difference between the line external disturbance voltages between the first coil 221 (as the first system) and the second coil 222 (as the second system) of the stator 220 of the motor 200. That is, it is possible for the adjustment part 132 to reduce the timing difference between the line external disturbance voltages between the first coil 221 and the second coil 222 of the stator 220 of the motor 200.

<Estimation Method which Estimates the Phase Angle θe of the Rotor 210 in the Motor 200 of the Rotating Electric Machine 400 Based on Supplied Disturbance Pulse Voltage>

FIG. 14 is a graph showing a time change of a modulation rate of the external disturbance voltage and a time change of an external disturbance current in a U phase of windings in the stator 220 of the rotor 200 in the rotating electric machine 400 according to the present invention. FIG. 15 is a graph showing a time change of a modulation rate of the external disturbance voltage and a time change of an external disturbance current in a V phase of the windings in the stator 220 of the motor 200 in the rotating electric machine according to the present invention. FIG. 16 is a graph showing a time change of a modulation rate of the external disturbance voltage and a time change of an external disturbance current in a W phase of the windings in the stator 220 of the motor 200 in the rotating electric machine according to the present invention.

As shown in FIG. 14 to FIG. 16, the external disturbance pulse voltages are supplied six times to the first system and the second system of the three phase windings, i.e. supplied to the U phase coils U1, V2, the V phase coils V1, V2 and the W phase coils W1, W2 in the first coil 221 and the second coil 222 of the stator 220. These external disturbance voltages are interposed to the drive voltages, where the output torque of the rotor 210 is generated by the drive voltages.

The external disturbance pulse voltages shown in FIG. 14 correspond to the external disturbance voltage instruction signals δu1, δu2 shown in FIG. 6.

A description will now be given of the estimation of the phase angle θe of the rotor 210 without performing the level adjustment of the external disturbance voltage instructions. In the following case, the phase angle θe of the rotor 210 is zero (θe=0°), i.e. α axis is equal to d axis.

The first supply of the pulse voltage to each of the first coil 221 and the second coil 222 is performed during the same period. That is, the pulse voltage is initiated at the timing ta, and a sign of the modulation rate of the pulse voltage is inverted at the timing when the period T has been elapsed. The period T is equal to the PWM period T shown in FIG. 6. The second supply of the pulse voltage has the same voltage amplitude and is performed after the pulse voltage is inverted. The second supply to the six supply of the pulse voltage are performed by the same procedure. This pulse voltage to be supplied during the double periods T will be referred to as the pulse voltage or the external disturbance pulse voltage.

Figure 18:
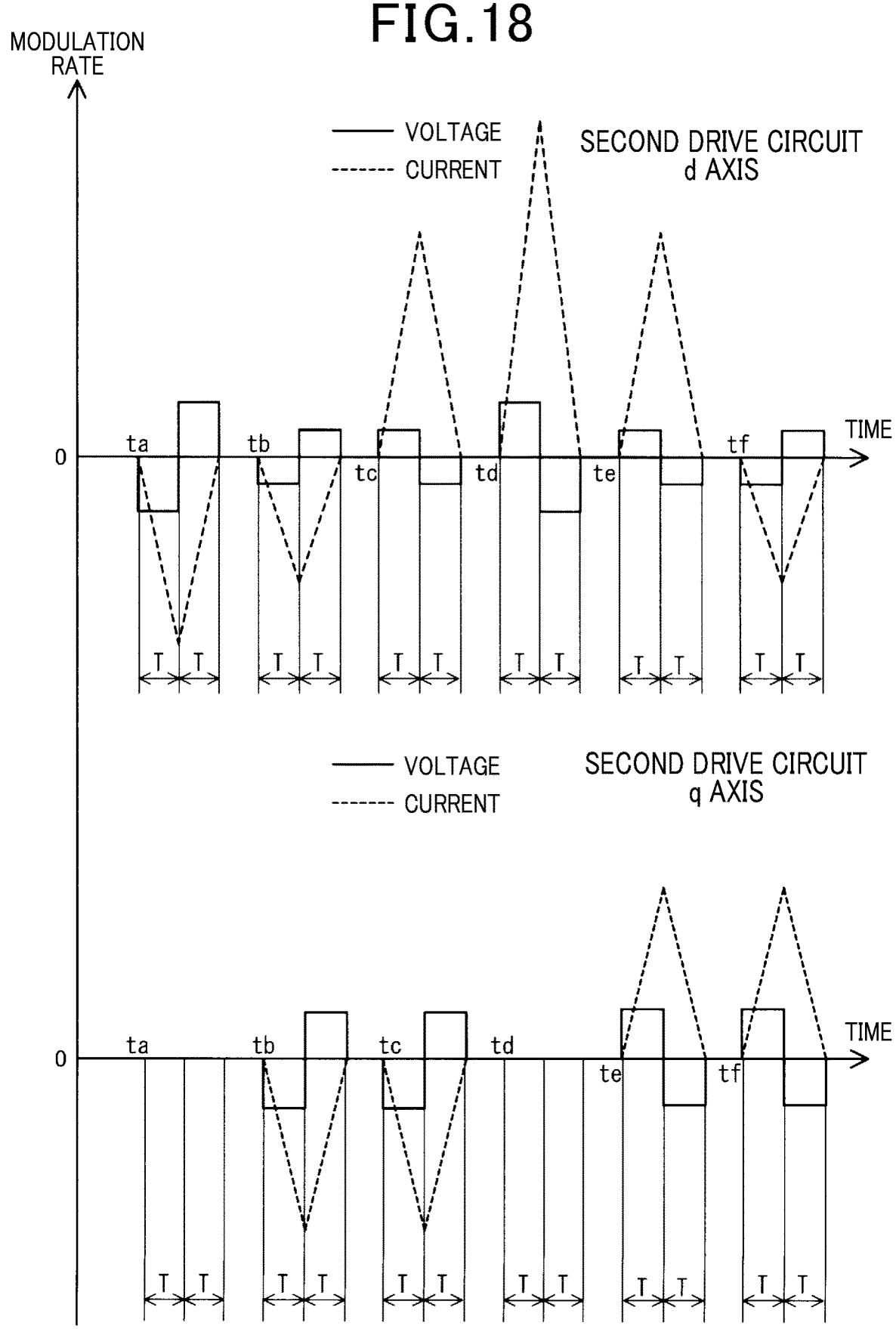
FIG. 18 is a graph showing a time change of a modulation ratio in the d axis and the q axis of the external disturbance pulse voltages, which correspond to the external disturbance pulse voltages shown in FIG. 14 to FIG. 16, and a time change of the external disturbance currents in the second coil of the stator.

FIG. 17 is a graph showing a time change of a modulation ratio in the d axis and the q axis of the external disturbance pulse voltages, which correspond to the external disturbance pulse voltages shown in FIG. 14 to FIG. 16, and a time change of the external disturbance currents in the first coil 221 of the stator 220 of the motor 200. FIG. 18 is a graph showing a time change of a modulation ratio in the d axis and the q axis of the external disturbance pulse voltages, which correspond to the external disturbance pulse voltages shown in FIG. 14 to FIG. 16, and a time change of the external disturbance currents in the second coil 222 of the stator 220 of the motor 200.

As previously described, a description will be given of the following case with reference to FIG. 17 and FIG. 18 because the α axis is equal to the d axis in the following case.

Figure 19A:
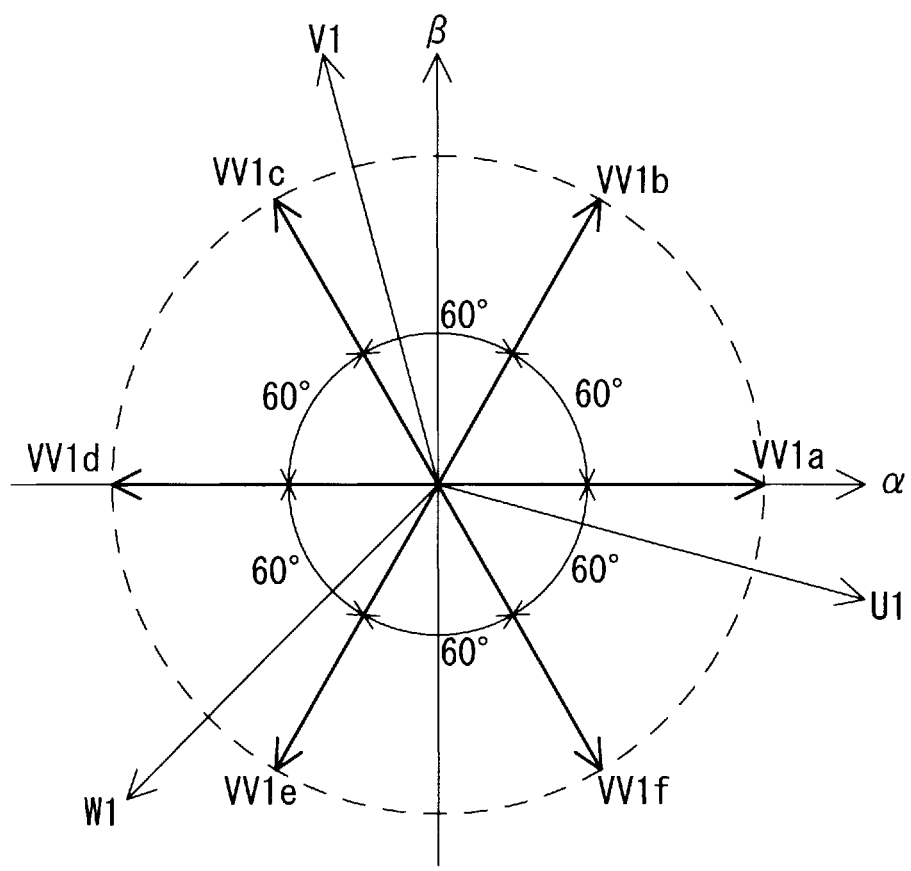
FIG. 19A is a view showing external disturbance voltage vectors supplied to the first coil of the stator of the motor in the rotating electric machine according to the present invention.

FIG. 19A is a view showing vectors of the external disturbance voltages (hereinafter, the external disturbance voltage vectors) supplied to the first coil 221 of the stator 220 of the motor 200 in the rotating electric machine 400 according to the present invention. As shown in FIG. 19A, the external disturbance voltage vectors VV1a, VV1b, VV1c, VV1d, VV1e and VV1f are supplied to the first coil 221 of the stator 220 of the motor 200 at six timings ta, tb, tc, td, te and tf, respectively. The direction of each of the external disturbance voltage vectors VV1a, VV1b, VV1c, VV1d, VV1e and VV1f corresponds to the direction every 60 degrees forward from the α axis, respectively.

Figure 19B:
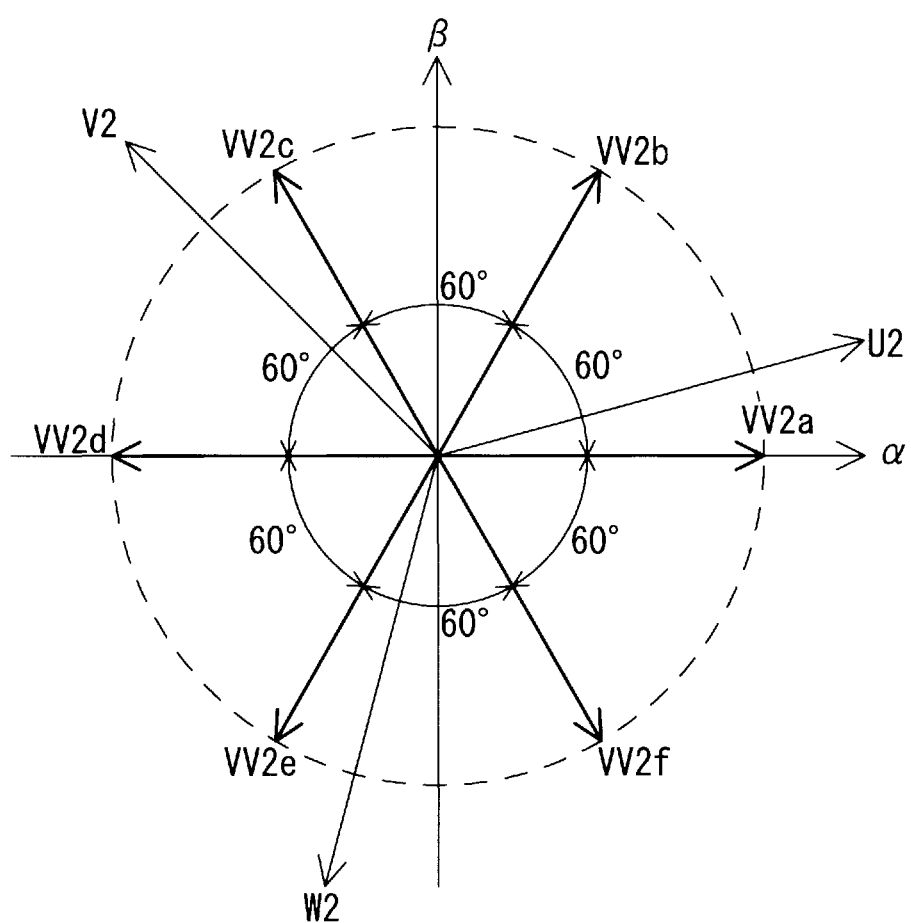
FIG. 19B is a view showing external disturbance voltage vectors supplied to the second coil of the stator of the motor in the rotating electric machine according to the present invention.

FIG. 19B is a view showing vectors of the external disturbance voltages (hereinafter, the external disturbance voltage vectors) supplied to the second coil 222 of the stator 220 of the motor 200 in the rotating electric machine 400 according to the present invention. Similarly, as shown in FIG. 19B, the external disturbance voltage vectors VV2a, VV2b, VV2c, VV2d, VV2e and VV2f are supplied to the second coil 222 of the stator 220 of the motor 200 at the six timings ta, tb, tc, td, te and tf, respectively. The direction of each of the external disturbance voltage vectors VV2a, VV2b, VV2c, VV2d, VV2e and VV2f corresponds to the direction every 60 degrees forward from the α axis, respectively.

The external disturbance voltage vectors VV1a, VV1b, VV1c, VV1d, VV1e and VV1f and the external disturbance voltage vectors VV2a, VV2b, VV2c, VV2d, VV2e and VV2f have the same absolute value (i.e. the same vector length) from each other.

Figure 20A:
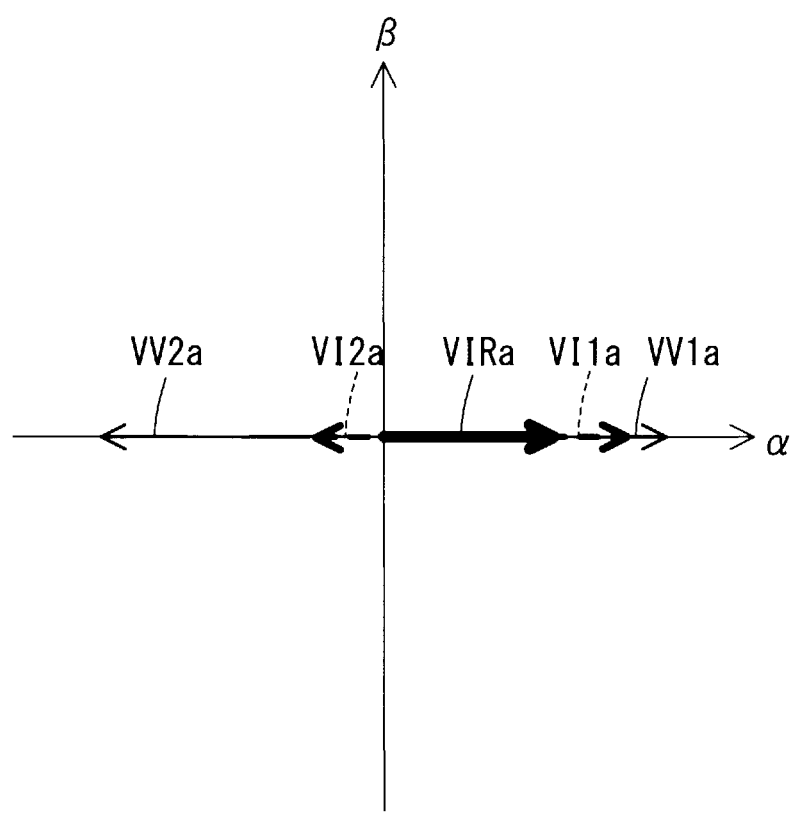
FIG. 20A is a view showing the external disturbance voltage vectors and the external disturbance current vectors supplied to the first coil at a timing ta.
Figure 20B:
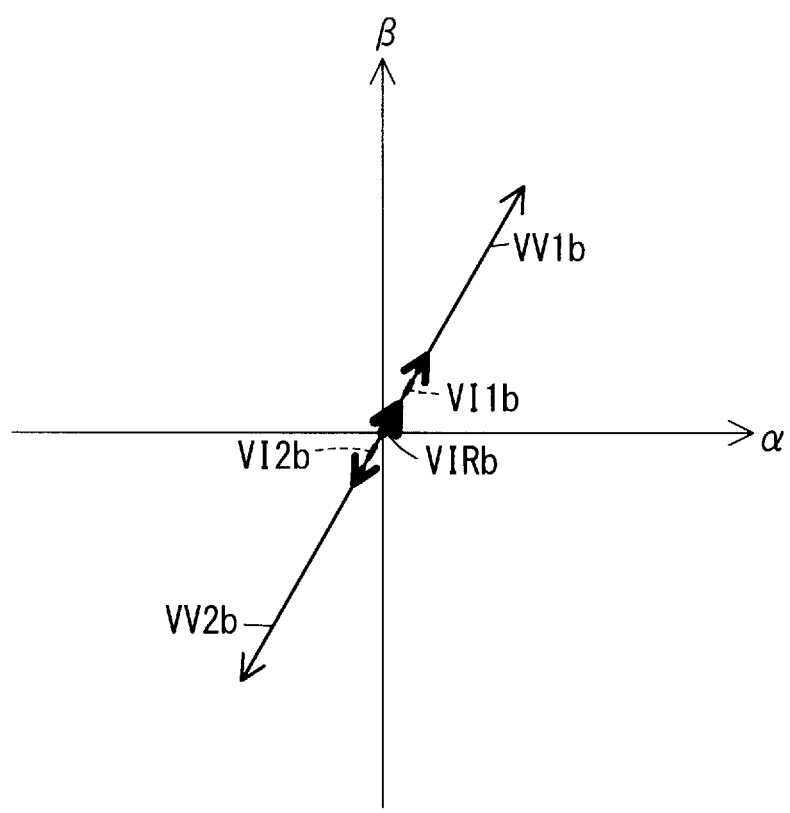
FIG. 20B is a view showing the external disturbance voltage vectors and the external disturbance current vectors supplied to the first coil at a timing tb.
Figure 20C:
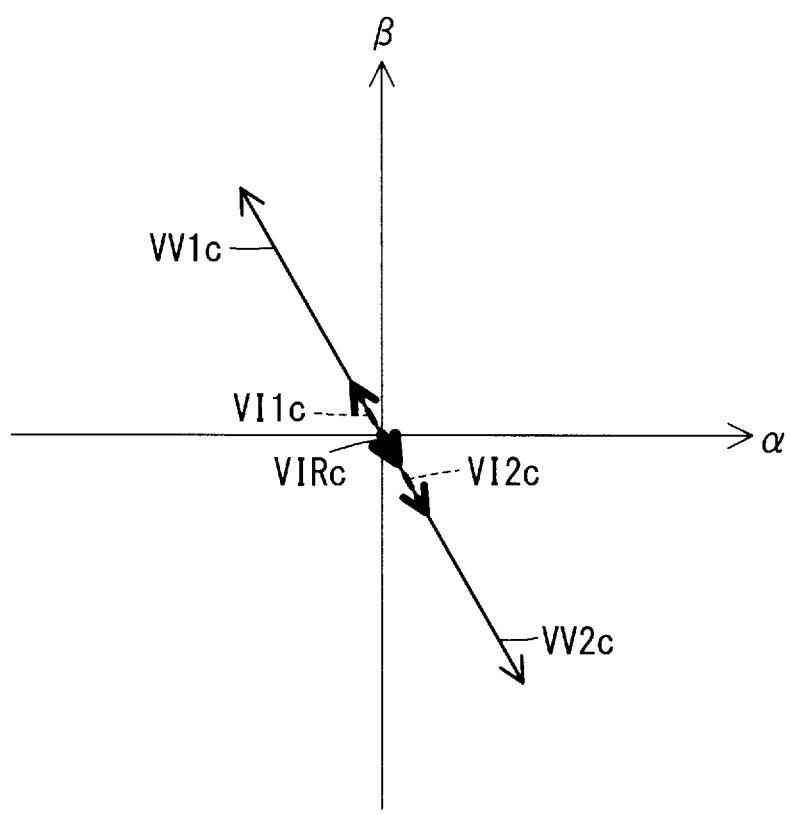
FIG. 20C is a view showing the external disturbance voltage vectors and the external disturbance current vectors supplied to the first coil at a timing tc.
Figure 20D:
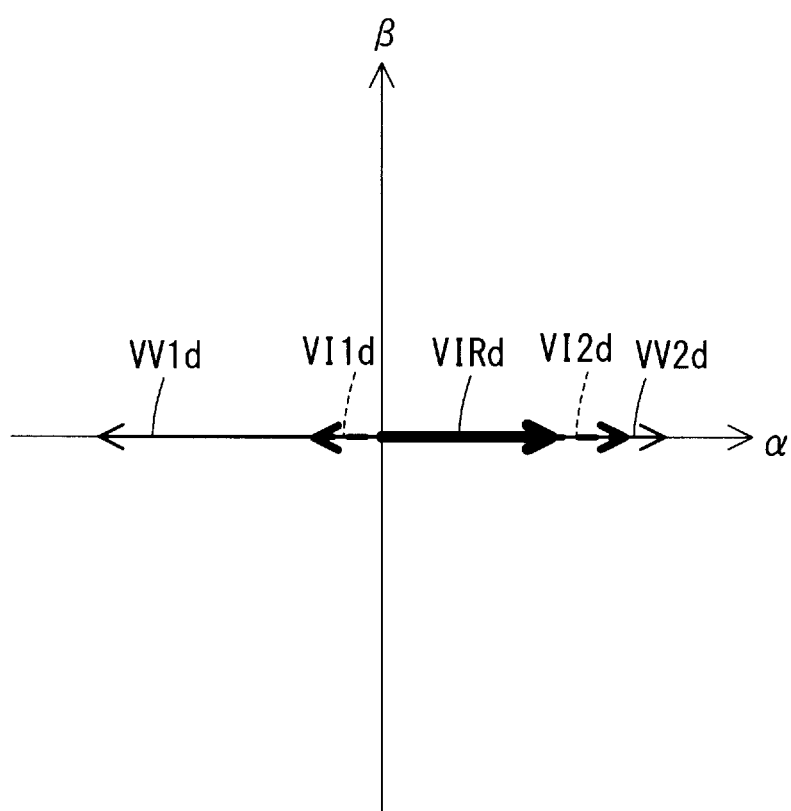
FIG. 20D is a view showing the external disturbance voltage vectors and the external disturbance current vectors supplied to the first coil at a timing td.
Figure 20E:
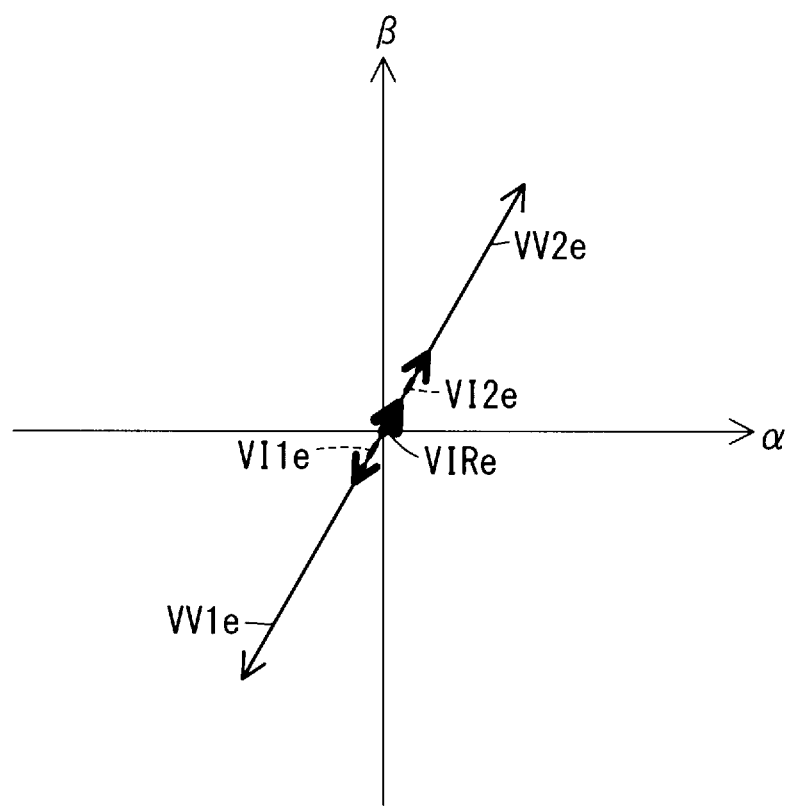
FIG. 20E is a view showing the external disturbance voltage vectors and the external disturbance current vectors supplied to the first coil at a timing te.
Figure 20F:
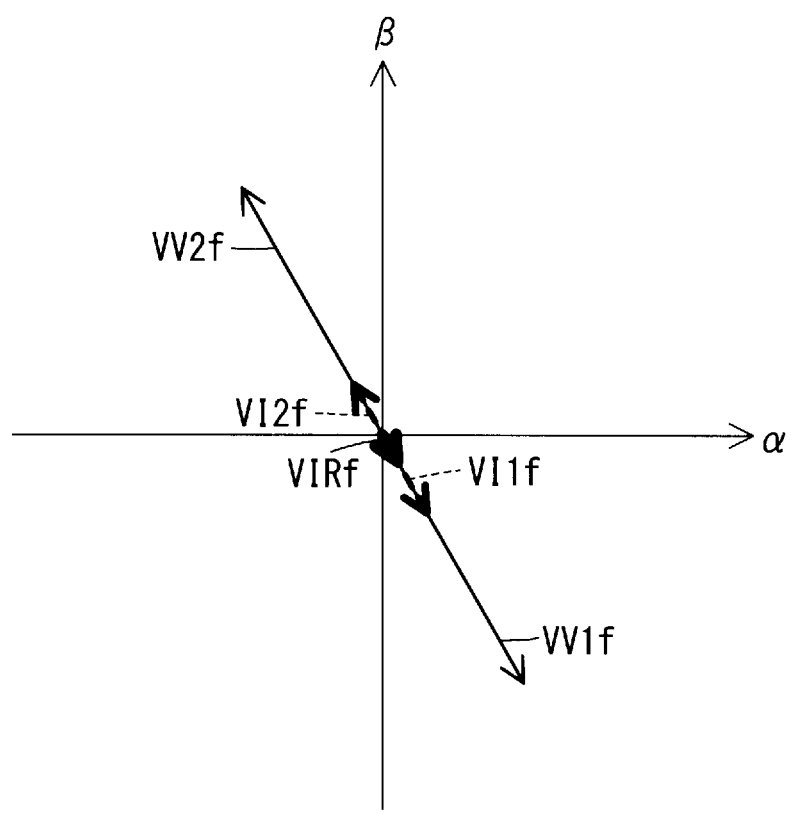
FIG. 20F is a view showing the external disturbance voltage vectors and the external disturbance current vectors supplied to the first coil at a timing tf.

FIG. 20A is a view showing the external disturbance voltage vectors and external disturbance current vectors supplied to the first coil at the timing ta. As shown in FIG. 20A, the external disturbance voltage vector V1a has the phase angle θe which is different from 180 degrees of the phase angle θe of the external disturbance voltage vector VV2a. The phase angle θe of the external disturbance voltage, i.e. the direction of the external disturbance voltage vector is determined on the basis of the voltage supplied at each timing during the first period T. For example, in a case in which the external disturbance pulse voltage is supplied to the first coil 221 at the timing ta, the modulation ratio of the external disturbance voltage supplied to the first coil during the first period T has a positive value in the d axis and becomes zero in the q axis shown in FIG. 17. Accordingly, the phase angle of the external disturbance voltage vector due to the external disturbance pulse voltage becomes zero degree (0°).

Because the external disturbance voltage vector VV1a and the external disturbance voltage vector VV2a have the same absolute value, the external disturbance voltage vector VV1a and the external disturbance voltage vector VV2a are in 180 degrees symmetry.

Other external disturbance voltage vectors VV1b to VV1f and external disturbance voltage vectors VV2b to VV2f have the same features, i.e. in 180 degrees symmetry, respectively.

FIG. 20B to FIG. 20F are views showing the vectors of the external disturbance voltages and the vectors of the external disturbance currents at the timing tb, the timing tc, the timing td, the timing te and the timing tf, respectively. As shown in FIG. 20A to FIG. 20F, the external disturbance currents are generated due to external disturbance voltage vectors VV1a, VV1b, VV1c, VV1d, VV1e, VV1f, VV2a, VV2b, VV2c, VV2d, VV2e and VV2f, respectively. The current acquisition part 150 acquires the external disturbance currents detected by and transmitted from the first current sensor 71 and the second current sensor 72. In more detail, the current acquisition part 150 receives the external disturbance current vectors VI1a, VI1b, VI1c, VI1d, VI1e and VI1f of the first coil 221 at the timings ta, tb, tc, td, te and tf, respectively, transmitted from the first current sensor 71. Further, the current acquisition part 150 receives the external disturbance current vectors VI2a, VI2b, VI2c, VI2d, VI2e and VI2f of the second coil 222 at the timings ta, tb, tc, td, te and tf, respectively, transmitted from the first current sensor 71.

A synthetic current vector VIRa is obtained by adding the external disturbance current vector VI1a in the first coil 221 at the timing ta and the external disturbance current vector VI2a in the second coil 222 at the timing ta together. Similarly, FIG. 20B to FIG. 20F show a synthetic current vectors VIRb, a synthetic current vector VIRc, a synthetic current vector VIRd, a synthetic current vector VIRe, and a synthetic current vector VIRf, respectively.

A permeability toward the radius direction of the rotor 210 from the central point of the rotor 210 does not present on the phase angle θe because of having an interior permanent magnet (IPM) type. Accordingly, in an ideal case, each of the external disturbance current vectors VI1a to VI1f has the same absolute value, and magnetic saturation does not occurs.

In other words, an absolute value of each of the external disturbance current vectors VI1a to VI1f has been determined to have cause magnetic saturation. In the first to fourth exemplary embodiments of the present invention previously described, because a voltage amplitude of the pulse voltage has been determined so as to cause magnetic saturation, the absolute value of each of the external disturbance current vectors VI1a to VI1f depends on a magnitude of the phase angle θe. It is therefore possible for the phase angle estimation part 160 (see FIG. 3) in the control part 100 to estimate the phase angle θe of the rotor 210 in the motor 200 with high accuracy.

The phase angle estimation part 160 in the control part 100 receives the external disturbance current vectors VI1a to VI1f and VI2a to VI2f transmitted from the current acquisition part 150 in the control part 100.

The phase angle estimation part 160 adds the external disturbance current vectors VI1a to VI1f and the corresponding external disturbance current vectors VI2a to VI2f together so as to calculate synthesis vectors VI1R and VI2R. The phase angle estimation part 160 estimates the phase angle θe of the rotor 210 which is an angle between the calculated the synthesis vectors VI1R and VI2R and the α axis.

Figure 21A:
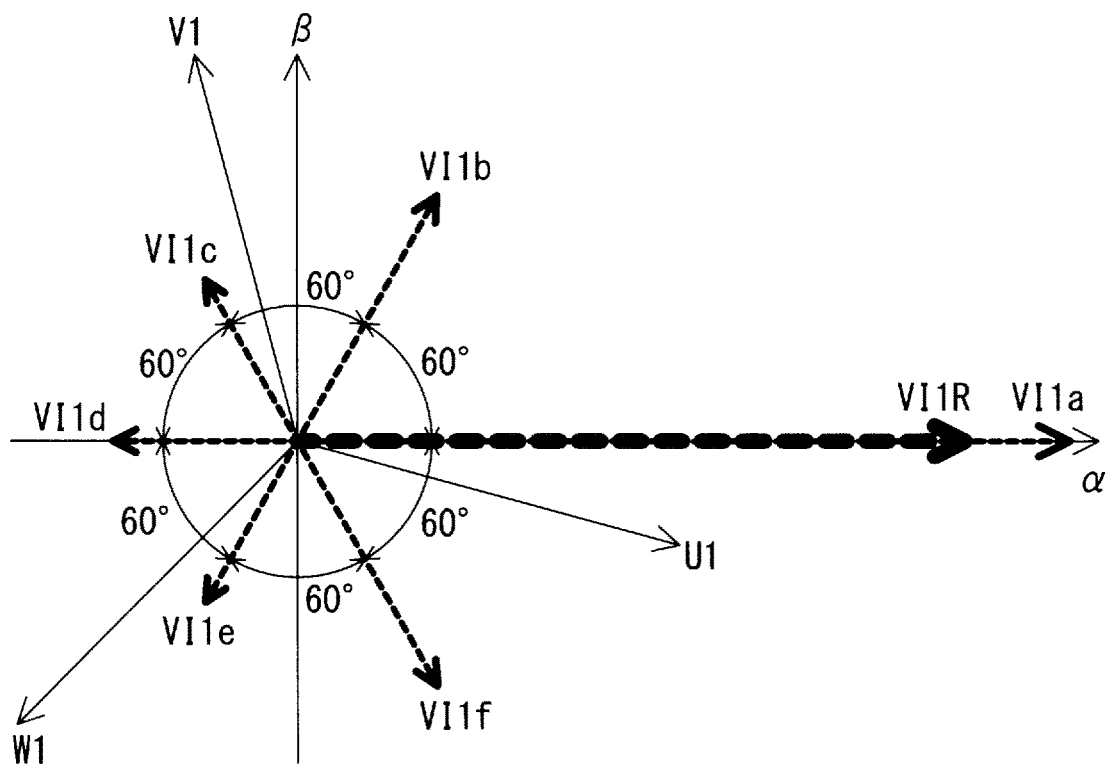
FIG. 21A is a view showing a synthesis vector of external disturbance current vectors generates in the first coil of the stator of the motor in the rotating electric machine according to the present invention.
Figure 21B:
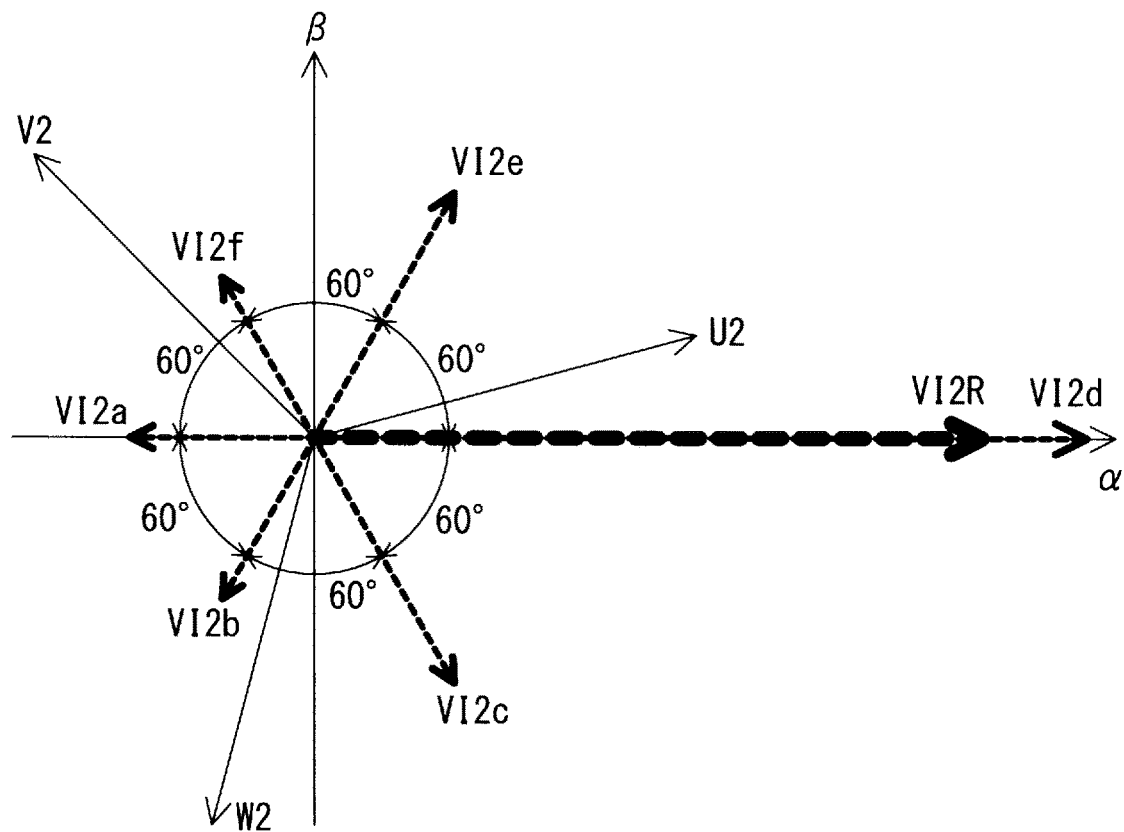
FIG. 21B is a view showing a synthesis vector of external disturbance current vectors generates in the second coil of the stator of the motor in the rotating electric machine according to the present invention.

FIG. 21A is a view showing the synthesis vector VI1R of the external disturbance current vectors generates in the first coil 221 of the stator 220 of the motor 200 in the rotating electric machine 400 according to the present invention. FIG. 21B is a view showing the synthesis vector VI2R of the external disturbance current vectors generates in the second coil 222 of the stator 220 of the motor 200 in the rotating electric machine 400.

The synthesis vector VI1R shown in FIG. 21A is a combination of the external disturbance current vectors VI1a to VI1f in the first coil 221 of the stator 220 of the motor 200. This synthesis vector VI1R is on the α axis. Similarly, the synthesis vector VI2R shown in FIG. 21B is a combination of the external disturbance current vectors VI2a to VI2f in the second coil 222 of the stator 220 of the motor 200. Similar to the synthesis vector VI1R, this synthesis vector VI2R is on the α axis. This feature can be obtained when the α axis and the d axis coincide from each other and magnetic saturation occurs.

In an ideal case, these two synthesis vectors, i.e. the synthesis vector VI1R and the synthesis vector VI2R are equal to each other. However, in an actual case, the synthesis vector VI1R is slightly shifted from the synthesis vector VI2R. The phase angle estimation part 160 adds the synthesis vector VI1R and the synthesis vector VI2R together to calculate an additional synthesis vector. It is possible for the phase angle estimation part 160 in the control part 100 to estimate the phase angle θe of the rotor 210 with high accuracy on the basis of the synthesis vector VI1R, the synthesis vector VI2R and the additional synthesis vector.

The rotating electric machine 400 according to the first to fourth exemplary embodiments of the present invention previously described has the following effects.

(First Effect)

The present invention provides the first effect which can reduce noise even if external disturbance pulse voltages are superimposed on the drive voltages to be supplied to the three phase windings in the first coil 221 and the second coil 222 of the stator 210 of the motor 200 so as to estimate the phase angle estimation part 160. As shown in FIG. 20A, only the synthesis vector VIRa is used as an actual external disturbance current during the period T counted from the timing Ta. This synthesis vector VIRa is calculated by a combination of the external disturbance current vector VI1a in the first coil 221 and the external disturbance current vector VI2a in the second coil 222, where the first coil 221 and the second coil 222 are the dual three phase windings of the stator 220 in the motor 200. The external disturbance current vector VI1a and the external disturbance current vector VI2a have a different phase by 180 degrees from each other. Because the pulse voltages are supplied to generate these current vectors in an opposite direction from each other, the absolute value of the synthesis vector VIRa is smaller than the absolute value of the external disturbance current vector VI1a. For this reason, even if a large pulse voltage is generated due to occurrence of the magnetic saturation, it is possible to reduce noise. This feature and phenomenon can also occur during the period counted from the timing Td. In order to explain this feature and phenomenon, the influence due to the magnetic saturation is emphasized in FIG. 20A to FIG. 20F and FIG. 21A and FIG. 21B more than in FIG. 14 to FIG. 18.

In the period counted from each of the timing tb, the timing to and the timing tf, the absolute value of each of the synthesis vectors VIRb, VIRe and VIRf is smaller than the absolute value of the corresponding external disturbance current vector having a larger value. This makes it possible to reduce the magnitude of noise. The corresponding external disturbance current vector having a larger value corresponds to the external disturbance current vector having a component in the positive direction on the d axis.

(Second Effect)

The present invention provides the second effect which can calculate and easily estimate the phase angle θe of the rotor 210 with high accuracy because the external disturbance voltage vectors VV1a, VV1b, VV1c, VV1d, VV1e and VV1f and the corresponding external disturbance voltage vectors VV2a, VV2b, VV2c, VV2d, VV2e and VV2f have the 60 degrees symmetry, and the current vectors can be detected every 60 degree intervals.

In the first exemplary embodiment to the fourth exemplary embodiment previously described, the six external disturbance voltages having a different vector direction are supplied to the three phase windings in the first coil 211 and the second coil 222 of the stator 220 of the motor 200, and detects the external disturbance currents corresponding to the six external disturbance voltages so as to estimate the phase angle θe of the rotor 210. However, the concept of the present invention is not limited by this. It is acceptable to use external disturbance voltages other than six. However, in order to estimate the phase angle θe of the rotor 210 with high accuracy, it is preferable to use the external disturbance voltages of not less than three having a different vector direction. It is possible to realize the phase angle estimation device performing the estimation method previously described by using the following structure.

<Example of a Structure of the Phase Angle Estimation Device>

It is possible for the phase angle estimation device according to the present invention to be a phase angle estimation device for estimating the phase angle θe of the rotor 210 as a field system in the motor 200. The motor 200 is equipped with the rotor 210 and the N coils (221 and 222, N is an integer of not less than two) having a different drive systems.

The phase angle estimation device has the drive circuits 30 and 40, the current acquisition section 150 and the phase angle estimation part 160.

The drive circuits 30, 40 supply the first pulse voltage to each of N pairs coils at the timing ta, supplies the second pulse voltage to them at the different timing tc which is different from the timing ta, and supplies the third pulse voltage at the different timing to which is different from both the timing ta and the timing tc. The current acquire part 150 acquires the first current vector VI1a which flows in at least the first coil 221 in the N pairs of the coils, the second current vector VI1c flowing at least one coil due to the second pulse voltage, and the third current vector flowing at least one pair of the coils. The phase angle estimation part 160 estimates the phase angle θe of the rotor 210 of the motor 200 on the basis of the first current vector, the second current vector and the third current vector. In this structure, it is necessary to satisfy at least one of that:

the vectors (VV1a, VV2a) of the N-first pulse voltages have a different direction;

the vectors (VV1c, VV2c) of the N-second pulse voltages have a different direction; and the vectors (VV1e, VV2e) of the N-third pulse voltages have a different direction.

This structure makes it possible to suppress noise from increasing due to the supply of the first to third pulse voltages to the first coil 221 and the second coil 222 of the stator 220 of the motor 200.

In the structure of the rotating electric machine previously described, the external disturbance pulse voltages are supplied in a plurality of different directions to the first coil 221 and the second coil 222 of the stator 220 of the motor 200. However, the concept of the present invention is not limited by this. It is acceptable to use another method of superimposing the external disturbance pulse voltages to the first coil 221 and the second coil 222 of the stator 220 of the motor 200. For example, Japanese patent No. 5145850 discloses a method of superimposing external disturbance pulse voltages in one direction, i.e. the estimated d axis only. This method makes it possible to estimate the phase angle θe of the rotor 210 of the motor 200. The explanation of this method is omitted here.

(Various Modifications)

The concept of the present invention is not limited by the first to fourth exemplary embodiments of the present invention. For example, it is possible to use the following various modifications.

(1) In the first to fourth exemplary embodiments previously described, the rotating electric machine 400 has the three phase windings in the first system and the second system, i.e. in the first coil 221 and the second coil 222. However, the concept of the present invention is not limited by this. It is acceptable for the three phase windings of the rotating electric machine 400 to have not less than three systems. In other words, the concept of the present invention is applied to rotating electric machines having not less than three phase windings having N systems (N is an integer of not less than two). In this case, the external disturbance pulse voltages are supplied to at least two systems in the three phase windings so as to estimate the rotor of the motor in the rotating electric machine. Further, it is also acceptable to supply the external disturbance pulse voltages to the overall three phase windings in the N systems so as to estimate the phase angle of the rotor.

(2) In the first to fourth exemplary embodiments previously described, the adjustment part 132 (see FIG. 5 or FIG. 13) adjusts a signal level of the supply voltage instruction signals or a signal level of the external disturbance voltage instruction signals so as to adjust a timing of the line external disturbance voltage. However, the concept of the present invention is not limited by this. It is acceptable to use another method so as to adjust a timing of the line external disturbance voltage. For example, it is acceptable to use, as the adjustment part 132, a device capable of adjusting a turn-on timing and a turn-off timing of a switching signal, and reducing a timing difference between the line external disturbance voltages of the three phase windings in the two systems more than the timing difference of them without performing the level adjustment while maintaining a duty ratio of the line external disturbance voltage in the three phase windings to that in the case without timing adjustment.

In addition, in order to reduce noise, it is preferable for the adjustment part 132 to adjust at least one of the turn-on timing and the turn-off timing of the line external disturbance voltage in the three phase windings in the two systems.

In order to reduce noise, it is possible to use a method of determining external disturbance pulse voltages on the basis of a map which has been made on the basis of the phase angle of the rotor 210, and of superimposing the determined external disturbance pulse voltages onto the three phase windings in the first system and the second system during a period in which no PWM controlled drive voltage is generated, instead of using the method of adjusting the signal level of the external disturbance voltage instruction signals according to the present invention. In this method, it is possible to use a previously-determined value as a reference value of the phase angle of the rotor 210. Further, it is preferable for the adjustment part 132 to perform the timing adjustment of the line external disturbance voltages according to the phase angle of the rotor 210 so as to reduce the timing difference between the corresponding line external disturbance voltages superimposed on the drive voltages to be supplied to the three phase windings in the first system and the second system.

(3) The first to fourth exemplary embodiments previously described use the external disturbance voltage vectors having a reverse direction (180 degrees difference) from each other. However, the concept of the present invention is not limited by this. For example, it is acceptable to use the external disturbance voltage vectors having another different direction unless the external disturbance voltage vectors to be supplied to the three phase windings in the first system and the second system do not have the same direction. That is, it is possible to reduce noise when there is a phase angle of non-zero in at least one supply of the external disturbance voltages. It is preferable for the absolute value of the synthesis current vectors during each period to be smaller than the absolute value of the external disturbance current vector having the maximum absolute value.

(4) The first to fourth exemplary embodiments previously described use the synchronous motor of the interior permanent magnet (IPM) type as the motor 200. However, the concept of the present invention is not limited by this. It is possible for the rotating electric machine to use a motor of a surface permanent magnet (SPM) type. Such a SPM type motor does not require superimposing large external disturbance voltages so as to cause the magnetic saturation when compared with the case of the IPM type motor. That is, in the IPM type motor, an inductance difference (Ld<Lq) is generated between the N pole direction (d axis) and a q axis direction (which progresses forward by 90 degrees) even if no magnetic saturation occurs and a current easily flow in the d axis rather than the q axis. For this reason, it is necessary to interpose large external disturbance voltages which cause magnetic saturation, and to correctly estimate the phase angle of the rotor 210 of the motor 200 with high accuracy.

When using a SPM type motor, it is preferable to use large external disturbance voltages which cause magnetic saturation. It is acceptable to apply the concept of the present invention to a rotor of a motor without using permanent magnets. It is acceptable to use a rotor of a winding field type. In the winding field type motor, windings are wound around a core and a current flows in the windings to generate magnetic poles.

(5) In the first to fourth exemplary embodiments previously described, the external disturbance voltages in six pairs are supplied to the three phase windings in the first system and the second system during one drive period Tdr (see FIG. 6). However, the concept of the present invention is not limited by this. For example, it is possible to supply the external disturbance voltages in other pairs instead of the six pairs. In order to estimate the phase angle of the rotor with high accuracy, it is preferable to supply the external disturbance voltages in M pairs (M is an integer of not less than 3) during one drive period Tdr. In the example shown in FIG. 14, it is acceptable to generate only the external disturbance voltages at the timing ta, the timing tc and the timing te.

In the first to fourth exemplary embodiments previously described, the vectors of the external disturbance voltages in the M pairs have a different phase angle of 360 degrees/M. However, the concept of the present invention is not limited by this. It is acceptable for the vectors of the external disturbance voltages in the M pairs to have a different phase angle of another value of not 360 degrees/M.

(6) In the first to fourth exemplary embodiments previously described, as shown in FIG. 19A and FIG. 19B, the external disturbance voltage vectors in M pairs have the same absolute value (i.e. the same vector length). However, the concept of the present invention is not limited by this. For example, it is acceptable to use some external disturbance voltages to cause magnetic saturation, and to use other external disturbance voltages not to cause any magnetic saturation.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A rotating electric machine comprising:
a motor comprising a stator and a rotor, the stator comprising three phase windings in a first coil and a second coil, and the rotor comprising magnetic poles; and
a drive control part which supplies drive voltages to the three phase windings of the stator,
wherein the drive control part comprises:
an external disturbance voltage instruction generation part which generates external disturbance voltage instruction signals to be used for superimposing external disturbance pulse voltages onto the three phase windings in the first coil and the second coil,
a switching signal generation part which generates switching signals, on the basis of the external disturbance voltage instruction signals, the switching signal to be used for superimposing the external disturbance pulse voltages onto the three phase windings in the first coil and the second coil,
a drive circuit which supplies the drive voltages including the external disturbance pulse voltages to the three phase windings in the first coil and the second coil on the basis of the switching signals,
a current acquisition part which acquires an external disturbance current generated in the three phase windings in the first coil and the second coil by superimposing the external disturbance pulse voltages onto the three phase windings in the first coil and the second coil,
a phase angle estimation part which estimates a phase angle of the rotor in the motor on the basis of the acquired an external disturbance current, and
an adjustment part which adjusts a turn-on timing and a turn-off timing of the switching signals so as to reduce a timing difference between corresponding line external disturbance voltages to be supplied to the three phase windings in the first coil and the second coil more than a timing difference between the corresponding line external disturbance voltages when the adjustment of the turn-on timing and the turn-off timing of the switching signals is not performed while maintaining a duty ratio of line external disturbance voltages between the three phase windings in the first coil and the second coil to a duty ratio of the line external disturbance voltages by the adjustment of the turn-on timing and the turn-off timing of the switching signals.

2. The rotating electric machine according to claim 1, wherein the adjustment part adjusts at least one of the turn-on timing and the turn-off timing of the switching signals so as to adjust, to zero, the timing difference between the corresponding line external disturbance voltages to be supplied to the three phase windings in the first coil and the second coil.

3. The rotating electric machine according to claim 1, further comprising:
a drive voltage instruction generation part which generates drive voltage instruction signals to be used for driving the motor of the rotating electric machine; and
a supply voltage instruction generation part comprising the adjustment part and an addition part, the addition part adding the drive voltage instruction signals and the corresponding external disturbance voltage instruction signals together so as to generate supply voltage instruction signals, and the adjustment part adjusting a level of each of the supply voltage instruction signals,
wherein the switching signal generation part performs a pulse width modulation control (PWM control) which compares the adjusted supply voltage instruction signals with a pulse width modulation comparison wave (PWM comparison wave) so as to generate the switching signals to be used for the three phase windings in the first coil and the second coil of the stator, and the adjustment part performs at least one of processes (i) and (ii) during adjacent two pulse width modulation periods (during adjacent two PWM periods) while maintaining a relative level difference between the three supply voltage instruction signals to be used for the three phase windings in the first coil and the second coil of the stator, where process (i) is a level adjustment of adjusting a level of the supply voltage instruction signal having a minimum level indicating a minimum voltage to a minimum level of the PWM comparison wave; and process (ii) is a level adjustment of adjusting a level of the supply voltage instruction signal having a maximum level indicating a maximum voltage to a maximum level of the PWM comparison wave.

4. The rotating electric machine according to claim 3, wherein the adjustment part adjusts the level of the supply voltage instruction signal having the minimum level to the minimum level of the PWM comparison wave during the adjacent two PWM periods.

5. The rotating electric machine according to claim 3, wherein the adjustment part adjusts the level of the supply voltage instruction signal having the maximum level to the maximum level of the PWM comparison wave during the adjacent two PWM periods.

6. The rotating electric machine according to claim 3, wherein the adjustment part adjusts the level of the supply voltage instruction signal having the minimum level to a level between with the minimum level and the maximum level of the PWM comparison wave during the adjacent two PWM periods.

7. The rotating electric machine according to claim 3, wherein the switching signal generation part generates the switching signals so that a phase difference between the corresponding line external disturbance voltages generated on the basis of the external disturbance pulse voltages in the three phase windings of the first coil and the second coil of the stator becomes non-zero.

8. The rotating electric machine according to claim 7, wherein the switching signal generation part generates the switching signals so that the phase difference between the corresponding line external disturbance voltages generated on the basis of the external disturbance pulse voltages in the three phase windings of the first coil and the second coil of the stator is 180 degrees, and a polarity of each of the corresponding line external disturbance voltages becomes opposite from each other.

9. The rotating electric machine according to claim 3, wherein the drive voltage instruction generation part generates the drive voltage instruction signals having a same waveform.

10. The rotating electric machine according to claim 3, wherein each of the three phase windings in the first coil and the second coil are arranged at an offset location from each other along a rotation direction of the rotor.

11. The rotating electric machine according to claim 1, further comprising:

a drive voltage instruction generation part which generates drive voltage instruction signals so as to drive the motor of the rotating electric machine; and a supply voltage instruction generation part comprising the adjustment part and an addition part, the adjustment part adjusting a level of each of the external disturbance voltage instruction signals, the addition part adding the adjusted external disturbance voltage instruction signals and the drive voltage instruction signals together so as to generate the supply voltage instruction signals, wherein the switching signal generation part performs a pulse width modulation control (PWM control) which compares each of the supply voltage instruction signals with a pulse width modulation comparison wave (PWM comparison wave) so as to generate the switching signals to be used for the three phase windings in the first coil and the second coil of the stator, and the adjustment part performs at least one of processes (iii) and (iv) during adjacent two pulse width modulation periods (adjacent two PWM periods) while maintaining a relative level difference between the three external disturbance voltage instruction signals corresponding to the three phase windings in the first coil and the second coil of the stator, where process (iii) is a level adjustment of adjusting a level of the external disturbance voltage instruction signal having a minimum level indicating a minimum voltage to a minimum level of the PWM comparison wave; and process (iv) is a level adjustment of adjusting a level of the external disturbance voltage instruction signal having a maximum level indicating a maximum voltage to a minimum level of the PWM comparison wave.

12. The rotating electric machine according to claim 11, wherein the adjustment part adjusts, to be within a range between a minimum level and a maximum level of the PWM comparison wave, each of the supply voltage instruction signal having the maximum level and the supply voltage instruction signals having the minimum level transmitted from the supply voltage instruction generation part to the switching signal generation part.

13. The rotating electric machine according to claim 11, wherein the switching signal generation part generates the switching signals so that a phase difference between the corresponding line external disturbance voltages generated on the basis of the external disturbance pulse voltages in the three phase windings of the first coil and the second coil of the stator becomes non-zero.

14. The rotating electric machine according to claim 13, wherein the switching signal generation part generates the switching signals so that the phase difference between the corresponding line external disturbance voltages generated on the basis of the external disturbance pulse voltages in the three phase windings of the first coil and the second coil is 180 degrees, and a polarity of each of the corresponding line external disturbance voltages becomes opposite from each other.

15. The rotating electric machine according to claim 11, wherein the drive voltage instruction generation part generates the drive voltage instruction signals having a same waveform.

16. The rotating electric machine according to claim 1, wherein the external disturbance voltage instruction generation part generates the external disturbance voltage instruction signals when the rotor is stopped, and the phase angle estimation part estimates a phase angle of the rotor when the rotor is stopped.

* * * * *